(12) United States Patent
Tamiazzo et al.

(10) Patent No.: US 9,515,362 B2
(45) Date of Patent: Dec. 6, 2016

(54) TUNABLE BANDPASS FILTER

(71) Applicant: CommScope Italy S.r.l., Agrate Brianza (IT)

(72) Inventors: Stefano Tamiazzo, Milan (IT); Giuseppe Resnati, Seregno (IT)

(73) Assignee: CommScope Technologies LLC, Hickory, NC (US)

(*) Notice: Subject to any disclaimer, the term of this patent is extended or adjusted under 35 U.S.C. 154(b) by 528 days.

(21) Appl. No.: 13/774,363

(22) Filed: Feb. 22, 2013

(65) Prior Publication Data

US 2013/0162374 A1 Jun. 27, 2013

Related U.S. Application Data

(63) Continuation-in-part of application No. PCT/IT2010/000375, filed on Aug. 25, 2010.

(51) Int. Cl.
H01P 1/205 (2006.01)
H01P 7/04 (2006.01)
(Continued)

(52) U.S. Cl.
CPC ........... H01P 1/20309 (2013.01); H01P 1/201 (2013.01); H01P 1/205 (2013.01);
(Continued)

(58) Field of Classification Search
CPC ...... H01P 1/202; H01P 1/205; H01P 1/2053; H01P 1/2084; H01P 1/2086; H01P 7/04; H01P 7/10; H01P 1/20309; H01P 1/201; H01P 11/00; H01P 11/007; H01P 2250/00; H03H 2250/00
USPC ............. 333/206, 207, 202, 219.1, 222–224, 333/227, 235
See application file for complete search history.

(56) References Cited

U.S. PATENT DOCUMENTS 4,360,793 A 11/1982 Rhodes et al.
4,835,499 A 5/1989 Pickett
(Continued)

FOREIGN PATENT DOCUMENTS

EP 0703634 A1 2/2003
EP 1025609 B1 7/2003
(Continued)

OTHER PUBLICATIONS

J. Brian Thomas, Cross-Coupling in Coaxial Cavity Filters, Apr. 2003, IEEE, vol. 51, 1368-1375.*
(Continued)

*Primary Examiner* — Stephen E Jones
*Assistant Examiner* — Rakesh Patel
(74) *Attorney, Agent, or Firm* — Myers Bigel, P.A.

(57) ABSTRACT

A bandpass filter has a combline structure having a plurality of cascaded nodes. A plurality of nodes in the filter are connected both to resonant elements (a.k.a. resonators) and non-resonant elements (including elements having inductances and/or capacitances that do not resonate in a predetermined frequency band of interest). The resonant frequencies of the resonant elements may be adjusted, in order to adjust the location of the center frequency and/or the width of the passband of the filter. The characteristics of the resonant and non-resonant elements are selected such that the poles of the filter, when plotted on the complex plane, move substantially along the imaginary axis when the resonant frequencies are adjusted, without substantial movement along the real axis. The resulting bandpass filter has substantially constant losses and substantially constant absolute selectivity over a relatively wide range of bandwidths.

21 Claims, 18 Drawing Sheets

(51) Int. Cl.
*H01P 1/203* (2006.01)
*H01P 1/201* (2006.01)
*H01P 11/00* (2006.01)
*H01P 1/208* (2006.01)
*H03H 7/12* (2006.01)
*H03H 7/01* (2006.01)

(52) U.S. Cl.
CPC .............. *H01P 1/2086* (2013.01); *H01P 7/04* (2013.01); *H01P 11/00* (2013.01); *H01P 11/007* (2013.01); *H03H 7/12* (2013.01); *H03H 7/0123* (2013.01); *H03H 7/1791* (2013.01); *H03H 2250/00* (2013.01); *Y10T 29/49826* (2015.01)

(56) References Cited

U.S. PATENT DOCUMENTS

| | | | |
|---|---|---|---|
| 4,992,759 | A | 2/1991 | Giraudeau et al. |
| 5,436,602 | A | 7/1995 | McVeety et al. |
| 5,495,215 | A | 2/1996 | Newell et al. |
| 5,502,422 | A | 3/1996 | Newell et al. |
| 5,543,758 | A | 8/1996 | Wey |
| 5,608,363 | A * | 3/1997 | Cameron .............. H01P 1/2084 333/202 |
| 5,675,301 | A | 10/1997 | Nappa et al. |
| 5,714,919 | A * | 2/1998 | Satoh et al. .................. 333/202 |
| 5,739,733 | A | 4/1998 | Cameron |
| 5,926,079 | A | 7/1999 | Heine et al. |
| 6,111,482 | A | 8/2000 | Atokawa |
| 6,222,429 | B1 | 4/2001 | Satoh et al. |
| 6,366,184 | B1 * | 4/2002 | Ohtonen ....................... 333/202 |
| 6,462,631 | B2 | 10/2002 | Bradley et al. |
| 6,597,265 | B2 | 7/2003 | Liang et al. |
| 6,801,104 | B2 | 10/2004 | Zhu et al. |
| 6,898,419 | B1 | 5/2005 | Fayeski et al. |
| 6,903,633 | B2 | 6/2005 | Zhu et al. |
| 7,116,954 | B2 | 10/2006 | Toncich |
| 7,236,068 | B2 | 6/2007 | Shamsaifar et al. |
| 7,545,240 | B2 | 6/2009 | Morga |
| 7,639,101 | B2 | 12/2009 | Tsuzuki et al. |
| 7,719,382 | B2 | 5/2010 | Tsuzuki et al. |
| 2003/0132820 | A1 | 7/2003 | Shamsaifar et al. |
| 2007/0120627 | A1 | 5/2007 | Kundu |
| 2009/0002102 | A1 | 1/2009 | Tsuzuki et al. |
| 2009/0072927 | A1 * | 3/2009 | Rhodes et al. ................ 333/202 |
| 2009/0261924 | A1 * | 10/2009 | Barrois ................ H01P 1/2053 333/206 |

FOREIGN PATENT DOCUMENTS

| | | |
|---|---|---|
| EP | 1538692 A1 | 6/2005 |
| WO | WO2009003190 A1 | 12/2008 |

OTHER PUBLICATIONS

Abunjaileh, A., "Combline filter with tunable bandwidth and centre frequency," Microwave Symposium Digest (MTT), 2010 IEEE MTT-S International, pp. 1476-1479, May 23-28, 2010.

Cogollos, S., et al., "Design procedure of low cost substrate microstrip filters based on nonresonating nodes," Microwave Symposium Digest, 2008 IEEE MTT-S International, pp. 543-546, Jun. 15-20, 2008.

Tang, W., et al., "Tunable microstrip quasi-elliptic function bandpass filters," Microwave Conference, 2009. EuMC 2009. European, pp. 767-770, Sep. 29, 2009-Oct. 1, 2009.

Fahmi, M.M., et al., "Compact Ridge Waveguide Filters With Arbitrarily Placed Transmission Zeros Using Nonresonating Nodes," IEEE Transactions on Microwave Theory and Techniques, vol. 57, No. 12, pp. 3354-3361, Dec. 2009.

International Search Report and Written Opinion; Mailed Jan. 28, 2011 for corresponding PCT Application No. PCT/IT2010/000375.

* cited by examiner

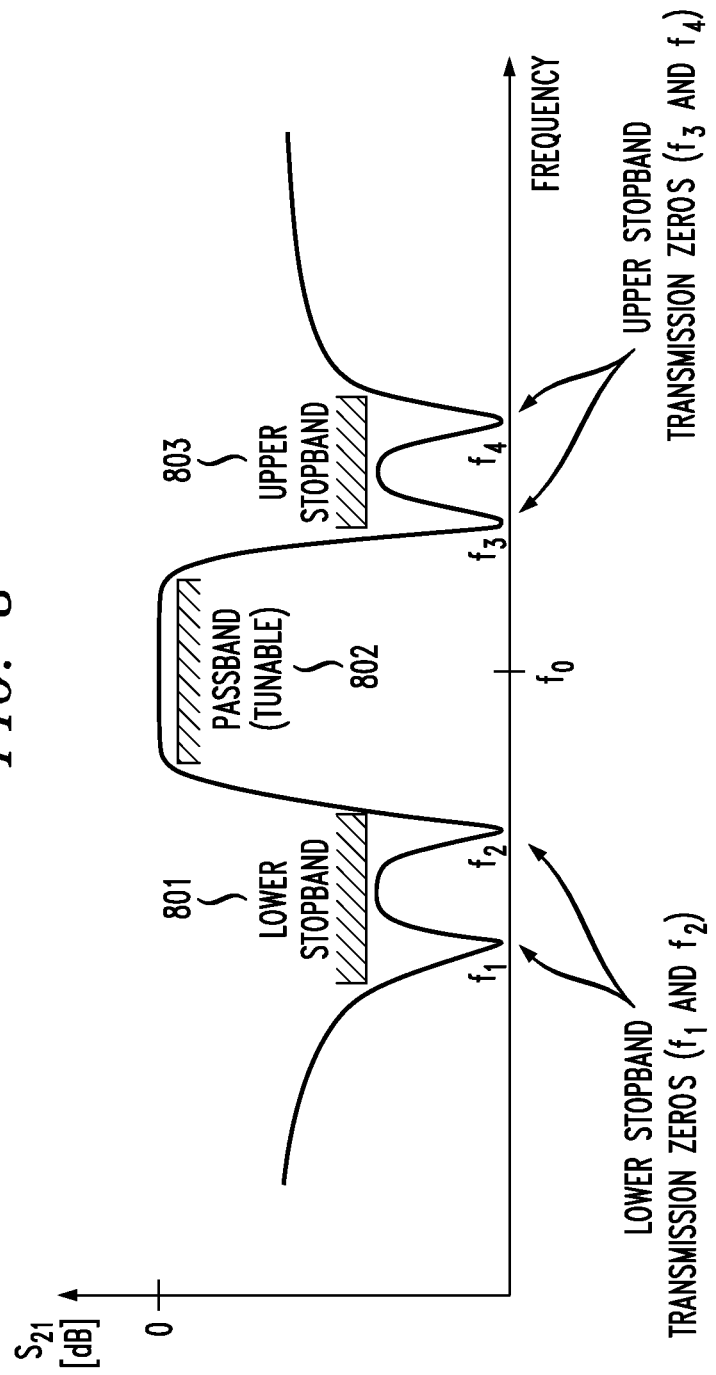

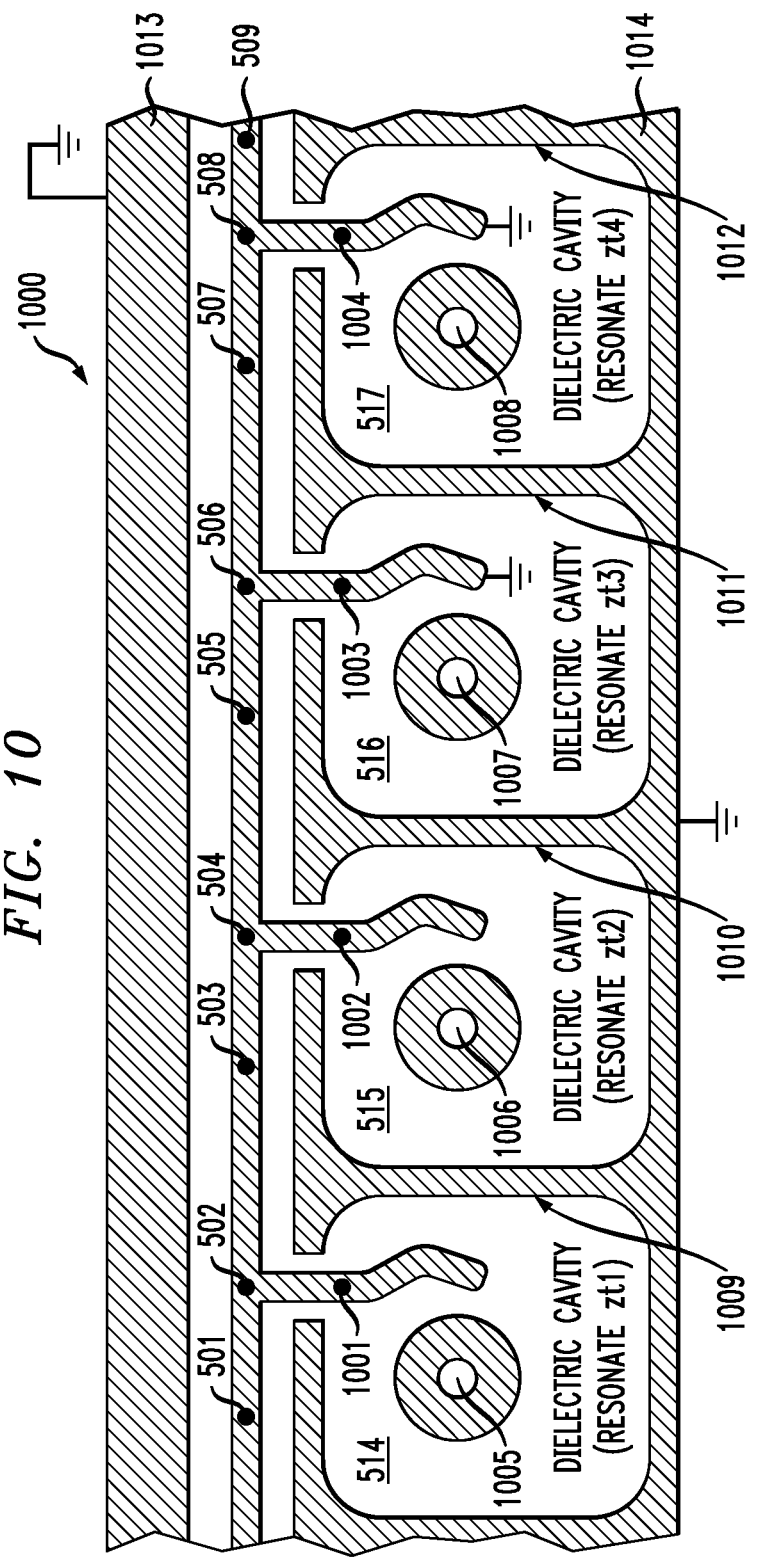

TABLE 1

|  | DUAL-BAND STRUCTURE | NRN STRUCTURE |
|---|---|---|
| FILTER ORDER (= NUMBER OF TUNABLE ELEMENTS) | N | N |
| RELATIVE SELECTIVITY | N/2, INDEPENDENT OF BANDWIDTH | LESS THAN N, DEPENDING ON BANDWIDTH |
| NEAR-BAND REJECTIONS | POOR | VERY GOOD |
| ABSOLUTE LOSSES | BANDWIDTH-DEPENDENT | INDEPENDENT OF BANDWIDTH |
| ABSOLUTE SELECTIVITY | BANDWIDTH-DEPENDENT | INDEPENDENT OF BANDWIDTH |

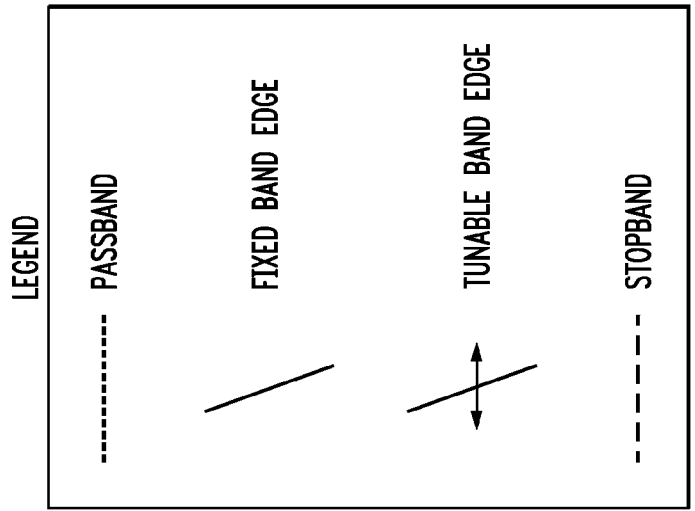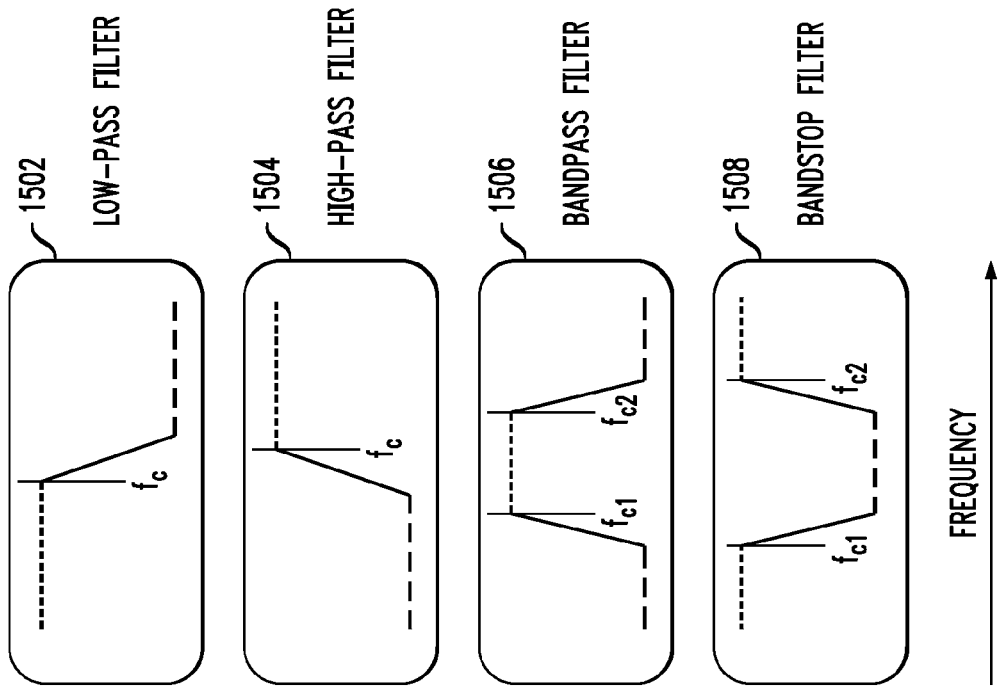
FIG. 15

FIG. 21(a)

TABLE 2

| FILTER | NUMBER OF BANDS | BLOCKS | APPLICATION IN LOW-LOSS COMBINER | NOTES |
|---|---|---|---|---|
| 1601 | 1 FULLY TUNABLE PASSBAND WITH LOWER AND HIGHER STOPBANDS | 1 TUNABLE LP<br>1 TUNABLE HP | COMBINES TX BANDS OF TWO OPERATORS OR STANDARDS, WITH ONE OPERATOR/STANDARD HAVING NON-CONTIGUOUS FREQUENCY BANDS | DUAL OF 1607 |
| 1607 | 1 FULLY TUNABLE STOPBAND WITH LOWER AND HIGHER PASSBANDS | 1 TUNABLE LP<br>1 TUNABLE HP | COMBINES TX BANDS OF TWO OPERATORS OR STANDARDS, WITH ONE OPERATOR/STANDARD HAVING NON-CONTIGUOUS FREQUENCY BANDS | DUAL OF 1601 |
| 1701 | 2 PARTIALLY TUNABLE PASSBANDS WITH HIGHER STOPBANDS | 2 TUNABLE LP<br>1 FIXED HP | COMBINES TX AND RX BANDS OF TWO OPERATORS OR STANDARDS, WITH BOTH OPERATORS/STANDARDS HAVING CONTIGUOUS FREQUENCY BANDS | DUAL OF 1709 |
| 1709 | 2 PARTIALLY TUNABLE PASSBANDS WITH LOWER STOPBANDS | 1 FIXED LP<br>2 TUNABLE HP | COMBINES TX AND RX BANDS OF TWO OPERATORS OR STANDARDS, WITH BOTH OPERATORS/STANDARDS HAVING CONTIGUOUS FREQUENCY BANDS | DUAL OF 1701 |
| 1801 | 2 PARTIALLY TUNABLE PASSBANDS WITH HIGHER STOPBANDS | 2 TUNABLE LP<br>1 FIXED HP | COMBINES TX AND RX BANDS OF TWO OPERATORS OR STANDARDS, WITH BOTH OPERATORS/STANDARDS HAVING CONTIGUOUS FREQUENCY BANDS | DUAL OF 1809 |

FIG. 21(b)

TABLE 2 (CONTINUED)

| FILTER | NUMBER OF BANDS | BLOCKS | APPLICATION IN LOW-LOSS COMBINER | NOTES |
|---|---|---|---|---|
| 1809 | 2 PARTIALLY TUNABLE PASSBANDS WITH LOWER STOPBANDS | 1 FIXED LP<br>2 TUNABLE HP | COMBINES TX AND RX BANDS OF TWO OPERATORS OR STANDARDS, WITH BOTH OPERATORS/STANDARDS HAVING CONTIGUOUS FREQUENCY BANDS | DUAL OF 1801 |
| 1901 | 2 FULLY TUNABLE PASSBANDS WITH LOWER, HIGHER AND INNER STOPBANDS | 2 TUNABLE LP<br>2 TUNABLE HP | COMBINES TX AND RX BANDS OF TWO OPERATORS OR STANDARDS, WITH ONE OPERATOR/STANDARD HAVING NON-CONTIGUOUS FREQUENCY BANDS | DUAL OF 1907 |
| 1907 | 2 FULLY TUNABLE STOPBANDS WITH LOWER, HIGHER AND INNER PASSBANDS | 2 TUNABLE LP<br>2 TUNABLE HP | COMBINES TX AND RX BANDS OF TWO OPERATORS OR STANDARDS, WITH ONE OPERATOR/STANDARD HAVING NON-CONTIGUOUS FREQUENCY BANDS | DUAL OF 1901 |
| 2001 | 2 FULLY TUNABLE PASSBANDS WITH LOWER, HIGHER AND INNER STOPBANDS | 2 TUNABLE LP<br>2 TUNABLE HP | COMBINES TX AND RX BANDS OF TWO OPERATORS OR STANDARDS, WITH ONE OPERATOR/STANDARD HAVING NON-CONTIGUOUS FREQUENCY BANDS | DUAL OF 2007 |
| 2007 | 2 FULLY TUNABLE STOPBANDS WITH LOWER, HIGHER AND INNER PASSBANDS | 2 TUNABLE LP<br>2 TUNABLE HP | COMBINES TX AND RX BANDS OF TWO OPERATORS OR STANDARDS, WITH ONE OPERATOR/STANDARD HAVING NON-CONTIGUOUS FREQUENCY BANDS | DUAL OF 2001 |

TUNABLE BANDPASS FILTER

CROSS-REFERENCE TO RELATED APPLICATIONS

This application is a continuation-in-part of International Application No. PCT/IT2010/000375, filed Aug. 25, 2010, under the teachings of which are incorporated herein by reference in their entirety.

BACKGROUND OF THE INVENTION

Field of the Invention

The present invention relates to electrical filters, and, more specifically but not exclusively, to high-power, high-quality-factor, tunable-bandwidth bandpass filters suitable for use, e.g., in combining contiguous, duplexed signals in WiMAX and LTE systems.

Description of the Related Art

Certain advanced mobile wireless standards, including the Worldwide Interoperability for Microwave Access (Wi-MAX) standard (IEEE 802.16) and the 3rd Generation Partnership Project (3GPP®) Long Term Evolution (LTE®) standard, require transmission channels to have a bandwidth that can vary, e.g., from a few megahertz to more than 10 MHz. As more and more consumers use WiMAX and LTE devices, the width of the frequency band allocated for such devices at a base station may be increased to provide an increased data transmission capacity, while the width of the frequency bands allocated for second-generation (2G) wireless devices at the base station may be decreased. As such, it would be desirable to have a bandwidth-tunable, low-insertion-loss, bandpass filter for use in advanced wireless base stations.

SUMMARY OF THE INVENTION

Problems in the prior art are addressed in accordance with the principles of the present invention by providing a bandpass filter having a combline structure with a plurality of cascaded nodes. The nodes in the filter are connected both to resonant elements (a.k.a. resonators) and non-resonant elements (including elements having inductances and/or capacitances to ground). The resonant elements have adjustable resonant frequencies that enable adjustment of the location of the center frequency and/or the width of the passband of the filter. The characteristics of the resonant and non-resonant elements are selected such that the poles of the filter, when plotted on the complex plane, move substantially parallel to the imaginary axis when the resonant frequencies are suitably adjusted to change the bandwidth of the filter, without substantial movement parallel to the real axis. The resulting bandpass filter has substantially constant losses and substantially constant absolute selectivity over a relatively wide range of bandwidths.

In one embodiment, the present invention is a filter for receiving an input signal and providing a filtered output signal. The filter comprises an input coupling adapted to receive the input signal, an output coupling adapted to provide the filtered output signal, and a plurality of transmission-line couplings. A plurality of nodes are connected in series between the input coupling and the output coupling, with each node being connected to each adjacent node through one of the transmission-line couplings. Each of a plurality of resonant elements is connected to a different node, and each resonant element has an adjustable resonant frequency. Each of a plurality of non-resonant elements is connected to a different node. At least one non-resonant element is one of (a) a capacitor coupled to ground and (b) a structure that is equivalent to a capacitor coupled to ground, and at least one non-resonant element is one of (a) an inductor coupled to ground and (b) a structure that is equivalent to an inductor coupled to ground. At least one resonant element provides a transmission zero at a frequency in a lower stopband of the combline filter. Finally, at least one resonant element provides a transmission zero at a frequency in an upper stopband of the filter, such that the filter has a bandpass filtering characteristic between the lower and upper stopbands.

In another embodiment, the invention is a method of constructing a combline filter adapted to receive an input signal and provide a filtered output signal. The method comprises: (a) providing an input coupling adapted to receive the input signal; (b) providing an output coupling adapted to provide the filtered output signal; (c) providing a plurality of transmission-line couplings; (d) providing a plurality of nodes connected in series between the input coupling and the output coupling, with each node being connected to each adjacent node through one of the transmission-line couplings; (e) providing a plurality of resonant elements, each connected to a different node and each having an adjustable resonant frequency; and (f) providing a plurality of non-resonant elements, each connected to a different node. At least one non-resonant element is one of (i) a capacitor coupled to ground and (ii) a structure that is equivalent to a capacitor coupled to ground, and at least one non-resonant element is one of (i) an inductor coupled to ground and (ii) a structure that is equivalent to an inductor coupled to ground. At least one resonant element provides a transmission zero at a frequency in a lower stopband of the combline filter, and at least one resonant element provides a transmission zero at a frequency in an upper stopband of the filter, such that the combline filter has a bandpass filtering characteristic between the lower and upper stopbands.

In still another embodiment, the invention is a method of adjusting a bandwidth of a filter comprising an input coupling adapted to receive the input signal, an output coupling adapted to provide the filtered output signal, a plurality of transmission-line couplings, a plurality of nodes connected in series between the input coupling and the output coupling, with each node being connected to each adjacent node through one of the transmission-line couplings; a plurality of resonant elements, each connected to a different node and each having an adjustable resonant frequency, and a plurality of non-resonant elements, each connected to a different node, wherein: (i) at least one non-resonant element is one of (a) a capacitor coupled to ground and (b) a structure that is equivalent to a capacitor coupled to ground, and at least one non-resonant element is one of (a) an inductor coupled to ground and (b) a structure that is equivalent to an inductor coupled to ground, (ii) a first resonant element provides a transmission zero at a first resonant frequency in a lower stopband of the filter, and (iii) a second resonant element provides a transmission zero at a second resonant frequency in an upper stopband of the filter, such that the filter has a bandpass filtering characteristic between the lower and upper stopbands. The method comprises adjusting a characteristic (e.g., a capacitance, resistance, or inductance) of the first resonant element, such that its resonant frequency is adjusted by a first frequency difference; and adjusting a characteristic (e.g., a capacitance, resistance, or inductance) of the second resonant element, such that its resonant frequency is adjusted by a negative of about the first frequency difference, wherein the bandwidth of the filter is adjusted without altering a center frequency of the filter. The filter may further comprise a third resonant element that provides a third transmission zero at a third resonant frequency in the lower stopband of the filter and a fourth resonant element that provides a fourth transmission zero at a fourth resonant frequency in the upper stopband of the filter. The method may further comprise: adjusting a characteristic (e.g., a capacitance, resistance, or inductance) of the third resonant element, such that its resonant frequency is adjusted by about the first frequency difference; and adjusting a characteristic (e.g., a capacitance, resistance, or inductance) of the fourth resonant element, such that its resonant frequency is adjusted by a negative of about the first frequency difference, wherein: (i) the resonant frequencies of the first and third resonant elements are adjusted uniformly by maintaining about a first relative frequency difference between the resonant frequencies of the first and third resonators before and after adjustment, (ii) the resonant frequencies of the second and fourth resonant elements are adjusted uniformly by maintaining about a second relative frequency difference between the resonant frequencies of the second and fourth resonators before and after adjustment, and (iii) the bandwidth of the filter is adjusted without altering an absolute selectivity of the filter.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 8 is a graph illustrating a frequency-response curve of the filter shown in FIG. 5, for a given bandwidth.

FIG. 10 is a plan view of an exemplary physical implementation of the filter shown in FIG. 5.

FIG. 15 is a legend identifying symbols used in FIGS. 16-20.

FIGS. 21(a) and 21(b) depict a table summarizing the characteristics and exemplary applications of the compound filters shown in FIGS. 16-20.

DETAILED DESCRIPTION

One possible solution to the problem of a high-Q, high-power, tunable-bandwidth filter is a combline-type filter (not shown) having an input coupling, followed by a plurality of resonators connected in series by couplings between the resonators, and an output coupling, wherein the resonant frequency of each resonator and the strength of each coupling are adjustable. Such a filter, however, usually results in a poor ratio between the maximum-attainable bandwidth and the minimum-attainable bandwidth, because the tuning ranges of the couplings are usually limited.

Figure 1:
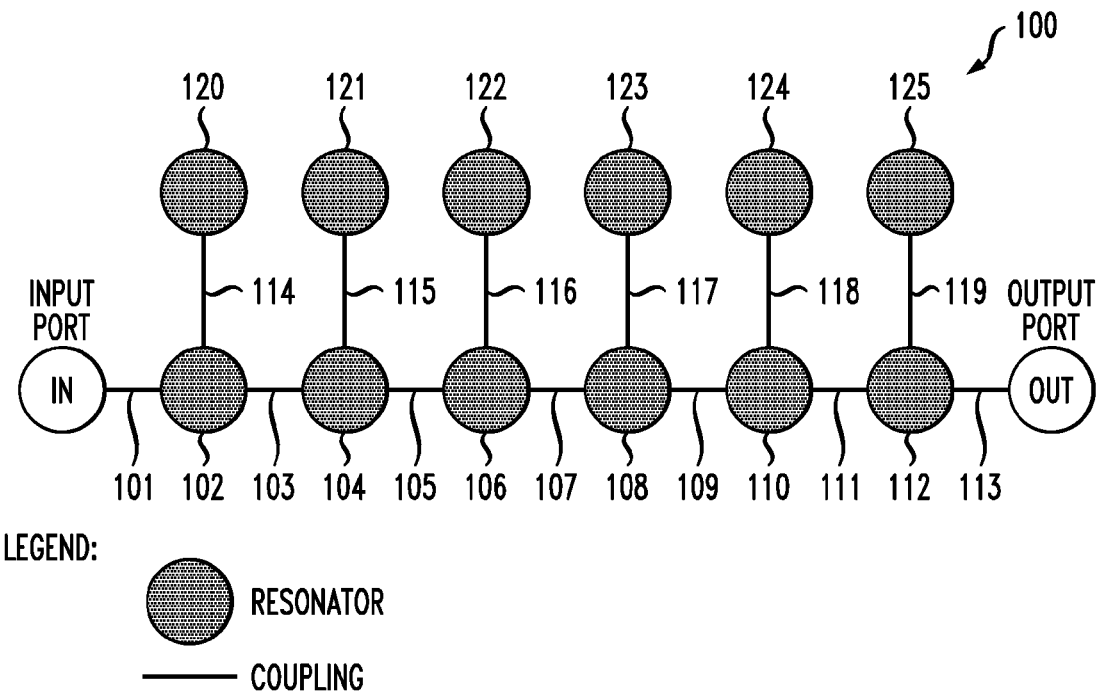
FIG. 1 is a filter topology diagram depicting an embodiment of a twelfth-order, adjustable-bandwidth, dual-band filter.

FIG. 1 depicts a twelfth-order, dual-band, tunable-bandwidth combline filter 100 based on a Chebyshev configuration that was proposed to overcome this problem. (See, e.g., Alaa I. Abunjaileh et al., Combline Filter with Tunable Bandwidth and Centre Frequency, International Microwave Symposium (IMS) 2010, the teachings of which are hereby incorporated by reference.) Filter 100 has an input coupling 101 connected to a plurality of resonators 102, 104, 106, 108, 110, and 112 that are connected in series through couplings 103, 105, 107, 109, and 111. Resonator 112 is connected to output coupling 113. Each of resonators 102, 104, 106, 108, 110, and 112 is connected to a respective one of branch resonators 120-125 by a respective one of couplings 114-119. In filter 100, the resonant frequencies of resonators 102, 104, 106, 108, 110, 112, and 120-125 are tunable, while the couplings are fixed. Filter 100 has two separate passbands, thereby making it a dual-band filter, and each passband has a sixth-order shape. Of the two passbands, only the lower passband is usually of interest, while the upper passband is irrelevant in its width and location, as long as it does not interfere too much with the lower one.

Each of resonators 102, 104, 106, 108, 110, 112, and 120-125 is implemented as a coaxial resonator with a tuning screw located over the open-circuited end of the resonator. The capacitance of each resonator and thereby the resonator's resonant frequency may be adjusted by adjusting the tuning screw. By properly controlling the resonant frequencies of the resonators, the bandwidth of the filter can be changed in both location and width.

Figure 2:
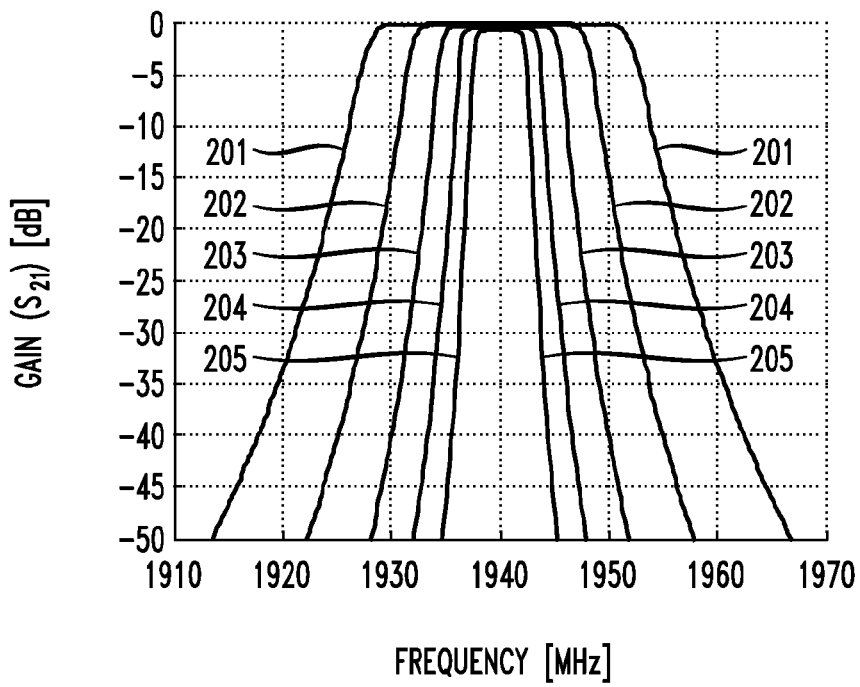
FIG. 2 is a graph illustrating frequency-response curves of the dual-band filter of FIG. 1, for five different bandwidths.
Figure 3:
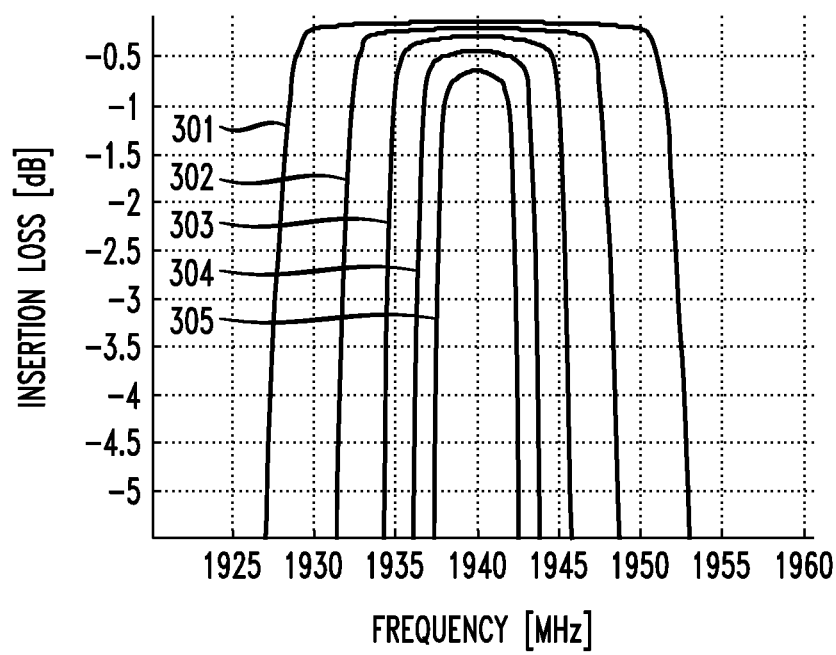
FIG. 3 is a graph illustrating the insertion loss curves of the dual-band filter of FIG. 1, for the same five different bandwidths as in FIG. 2.
Figure 4:
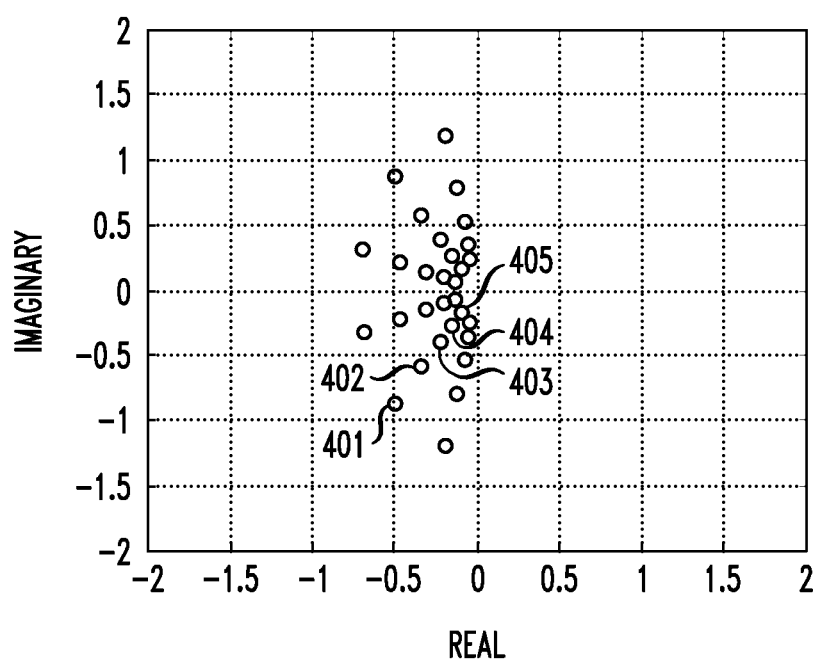
FIG. 4 is a graph illustrating the pole locations of the dual-band filter of FIG. 1, for the same five different bandwidths as in FIG. 2.

FIGS. 2-4 illustrate simulated effects of adjusting the resonant frequencies of resonators in filter 100, in order to change the filter's bandwidth. FIG. 2 is a graph showing the logarithmic gain (loss) (i.e., the logarithmic representation of the 2-port scattering parameter $S_{21}$) of filter 100 versus frequency. Five response curves 204-205 are shown for five different settings of the filter's resonators corresponding to five different bandwidths in order of decreasing bandwidth, but having the same center frequency.

Certain characteristics of filter 100 may be observed from FIG. 2. For example, the absolute selectivity of filter 100 is the slope of the frequency-response curve at or near the transitions from the passband to the upper and/or lower stopband, without regard to the bandwidth of the filter, in decibels per megahertz (dB/MHz). The absolute selectivity of filters in a receiver is relevant to determining the width of the guard band between adjacent passbands in the receiver. It may be seen from FIG. 2 that the absolute selectivity of filter 100 decreases as the bandwidth of the filter is increased.

Another characteristic that may be observed from FIG. 2 is the relative selectivity of filter 100. Relative selectivity is defined as the product of the filter's bandwidth times the absolute selectivity. Relative selectivity identifies how selective a filter is, relative to its bandwidth. For example, a filter having a 1-MHz bandwidth and an absolute selectivity of 10 dB/MHz would have a relative selectivity of 10 dB, while a filter having a 10-MHz bandwidth and the same selectivity would have a relative selectivity of 100 dB. It may be seen from FIG. 2 that the relative selectivity of filter 100 is generally preserved as bandwidth increases.

FIG. 3 is a graph of the absolute insertion loss of filter 100 (in logarithmic scale) versus frequency. The absolute insertion loss of a filter is the loss of signal power resulting from the insertion of the filter in a transmission path, without regard to the bandwidth of the filter. FIG. 3 shows five insertion-loss curves 301-305, which respectively correspond to response curves 201-205 of FIG. 2. It may be seen from FIG. 3 that, as the bandwidth of filter 100 is decreased, the absolute insertion loss increases. Indeed, the absolute insertion loss is inversely proportional to bandwidth and almost doubles in value when the bandwidth is reduced by half. For example, the absolute insertion loss at the center frequency (1940 MHz) is about −0.3 dB for loss curve 303 (corresponding to response curve 203) and about −0.6 dB for loss curve 305 (corresponding to response curve 205).

The relative insertion loss of filter 100 may also be derived from FIGS. 2 and 3. Relative insertion loss of a filter is the product of the filter's bandwidth times the absolute insertion loss. Relative insertion loss identifies how lossy a filter is, relative to its bandwidth. It may be seen from FIGS. 2 and 3 that, as the bandwidth of filter 100 is decreased, the relative insertion loss is generally preserved.

Although the absolute input and output return losses of filter 100 are not shown in FIG. 3, it is anticipated that they become worse with increased bandwidth, unless an additional resonant node were added at both the input and output of the filter. (The absolute input (output) return loss is the loss of signal power resulting from the reflection caused at the input (output) of a filter in a transmission path, without regard for the bandwidth of the filter.) Taken altogether, the above results are considered to be significant disadvantages for low-loss combining applications.

FIG. 4 is a diagram showing the movement of the poles of filter 100 in the complex plane as the magnitude of the bandwidth is changed. In order to more easily compare the poles of filter 100 with other adjustable filters having different bandwidths, before graphing the poles of filter 100, its transfer function was normalized in a manner well-known to those of ordinary skill in the art, by normalizing a predetermined bandwidth (e.g., a maximum bandwidth value of filter 100, which for filter 100 corresponds to curve 301 in FIG. 3) to the interval from −1 Hz to 1 Hz. This normalization is performed by using the inverse of the well-known band-pass transformation $$f_L = \frac{f_0}{B}\left(\frac{f_B}{f_0} - \frac{f_0}{f_B}\right),$$

where $f_0$ is the center frequency, B is the predetermined bandwidth, $f_B$ is the bandpass-frequency variable, and $f_L$ is the low-pass, or normalized, frequency variable. The bandpass-filter response is effectively converted to a low-pass-filter response having a 1 HZ cut-off frequency. Assuming that the predetermined bandwidth is selected to be the equal to a maximum bandwidth value of the filter, 1 Hz corresponds to the normalized predetermined maximum bandwidth that the filter can deliver. Other bandwidth values less than the predetermined maximum bandwidth are mapped into normalized cut-off frequencies correspondingly less than 1 Hz, as is well-known to those of ordinary skill in the art.

In FIG. 4, the spread of the poles along the vertical axis is directly related to the width of the passband. The distance of the poles to the vertical axis is related to the way that selectivity and losses vary with bandwidth. It may be seen from FIG. 4 that the six poles of the lower passband of filter 100, for a given bandwidth, form a semi-elliptical pattern and that the poles tend to move closer to both the real and imaginary axes (i.e., toward the origin point 0,0) as the bandwidth is decreased. For example, circles 401-405 in FIG. 4 represent corresponding poles for the five different response curves 204-205 of FIG. 2, when the different filter responses are normalized with respect to the predetermined maximum bandwidth value, as explained above. The corresponding poles tend to move both horizontally toward the imaginary axis and vertically toward the real axis as the bandwidth is decreased.

Filters having an architecture similar to filter 100 of FIG. 1 make inefficient use of resonators. If N is the (even) order of a filter (where N=12 in FIG. 1), only N/2(=6) elements are effectively used in building the useful passband. When viewed as a single-band filter, the filter thus has a low filtering efficiency, because N resonators are used to form an N/2-order passband.

In addition, the near-band rejections of filters similar to filter 100 are limited by the number of transmission zeros that can be generated by such structures. Only N/2 zeros can be introduced with the shown topology. Further, the allowable locations for such zeros are restricted to a limited area in between the two passbands. As such, filters similar to filter 100 have a very limited near-band-rejection capability and are not well-suited for use in WiMAX or LTE systems.

Figure 5:
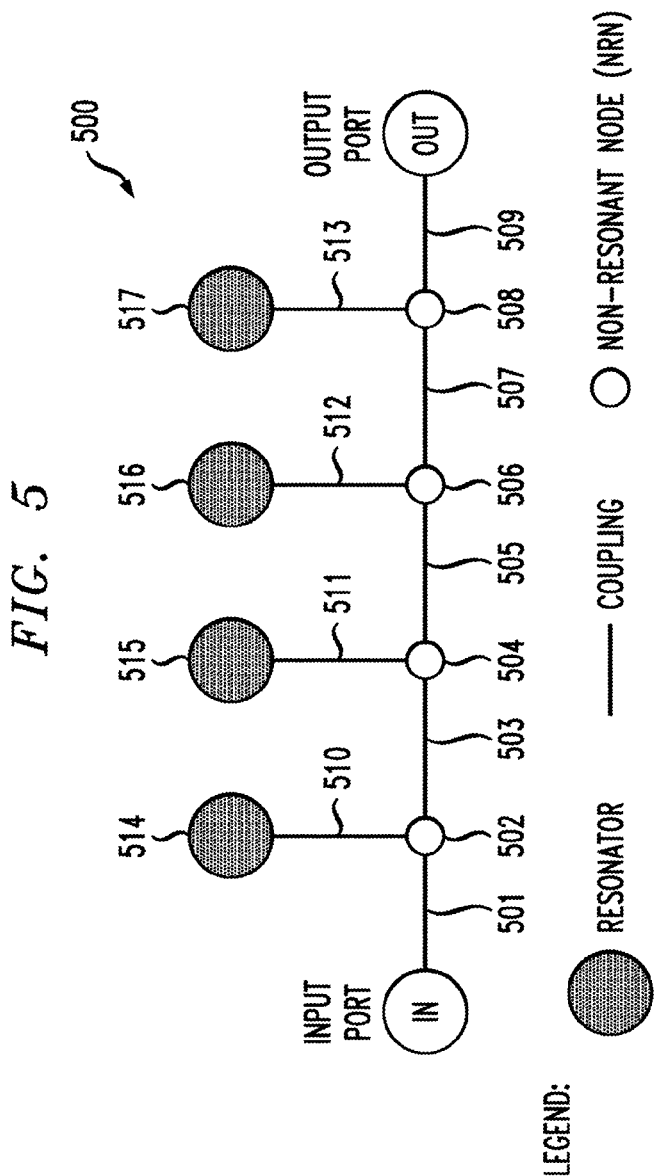
FIG. 5 is a simplified filter topology diagram depicting a fourth-order, adjustable-bandwidth filter in accordance with one embodiment of the invention.

FIG. 5 is a simplified coupling diagram depicting a fourth-order combline filter 500 having four non-resonant nodes in accordance with one embodiment of the invention. Filter 500 comprises an input coupling 501, connected to four non-resonant nodes 502, 504, 506, 508, which are connected in series through couplings 503, 505, and 507. A non-resonant node is a node connected to ground through a path comprising at least one circuit element, wherein the path has no resonances in a predetermined bandwidth of interest (e.g, the frequency band comprising the filter's passband and stopbands). Non-resonant node 508 is connected to output coupling 509. Each of non-resonant nodes 502, 504, 506, and 508 is connected to a respective one of branch resonators 514-517 by a respective one of branch couplings 510-513. In filter 500, the resonant frequencies of resonators 514-517 are tunable, while the couplings and the non-resonant nodes are fixed.

Each of resonators 514-517 may be implemented as a coaxial resonator (a.k.a. cavity resonator) or as a dielectric resonator. Note that filter 500 can have all coaxial resonators or all dielectric resonators or a mixture of one or more coaxial resonators and one or more dielectric resonators. In one embodiment, each of resonators 514-517 has a tuning screw located over the open-circuited end of the resonator. The capacitance of each resonator and thereby the resonator's resonant frequency may thus be adjusted by adjusting the tuning screw. By properly controlling the resonant frequencies of the different resonators, the useful bandwidth of the filter can be changed in both location and width.

Couplings 501, 503, 505, 507, 509, and 510-513 may be implemented via any known coupling element or coupling structures, including but not limited to coaxial or microstrip transmission lines, structures providing proximity coupling, and structures providing capacitive- or inductive-probe coupling. In one embodiment, couplings 503, 505, and 507 are implemented as microstrip transmission lines having a length that is approximately equal to (though not necessarily equal to) the wavelength of the center frequency $f_0$ of filter 500 divided by four (i.e., $$\left(i.e., l \cong \frac{\lambda}{4}\right).$$

Transmission lines of other lengths may also be used, depending on the design of the filter, including, e.g., mechanical constraints.

Resonators 514, 515, 516, and 517 introduce a plurality of transmission zeros into the transfer function of filter 500 and thereby greatly enhance its selectivity. Steep rejection skirts (a.k.a. passband-to-stopband transitions) may thereby be obtained.

Figure 6:
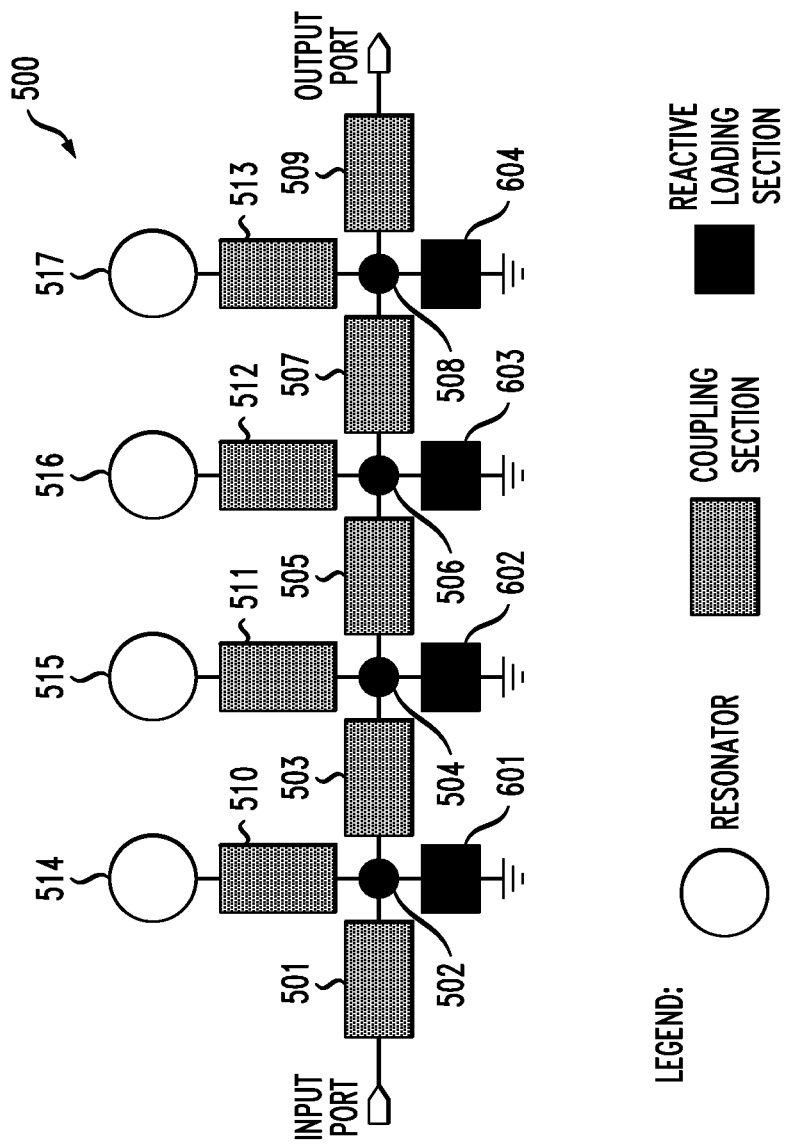
FIG. 6 is a more-detailed filter topology diagram depicting the filter shown in FIG. 5.

FIG. 6 is a more-detailed diagram of the filter depicted in FIG. 5. In FIG. 6, each non-resonant node 502, 504, 506, and 508 is connected to ground through a different path containing one or more reactive, non-resonant elements 601, 602, 603, 604. A non-resonant element, as used herein, is a circuit element having no resonances in a predetermined frequency band. In one embodiment, non-resonant elements are implemented as stubs connected to each non-resonant node. In microwave and radio-frequency engineering, a stub is a length of transmission line or waveguide that is connected at one end only. The free end of the stub is either left open-circuited or (especially in the case of waveguides) short-circuited. Neglecting transmission line losses, the input impedance of the stub is purely reactive; either capacitive or inductive, depending on the electrical length of the stub, and on whether it is left open- or short-circuited. Stubs may thus be considered to be frequency-dependent capacitors and frequency-dependent inductors.

In another embodiment, the non-resonant elements 601, 602, 603, 604 are implemented via branch couplings 510-513 connecting the non-resonant nodes and resonators 514-517, by designing branch couplings 510-513 to have appropriate capacitances and/or inductances electromagnetically coupled to ground (as discussed below with respect to FIG. 10, below). In still another embodiment, the non-resonant elements are implemented via both stubs and branch couplings. The selected lengths of couplings 503, 505, and 507 may also influence the design values of non-resonant elements 601-604.

Figure 7:
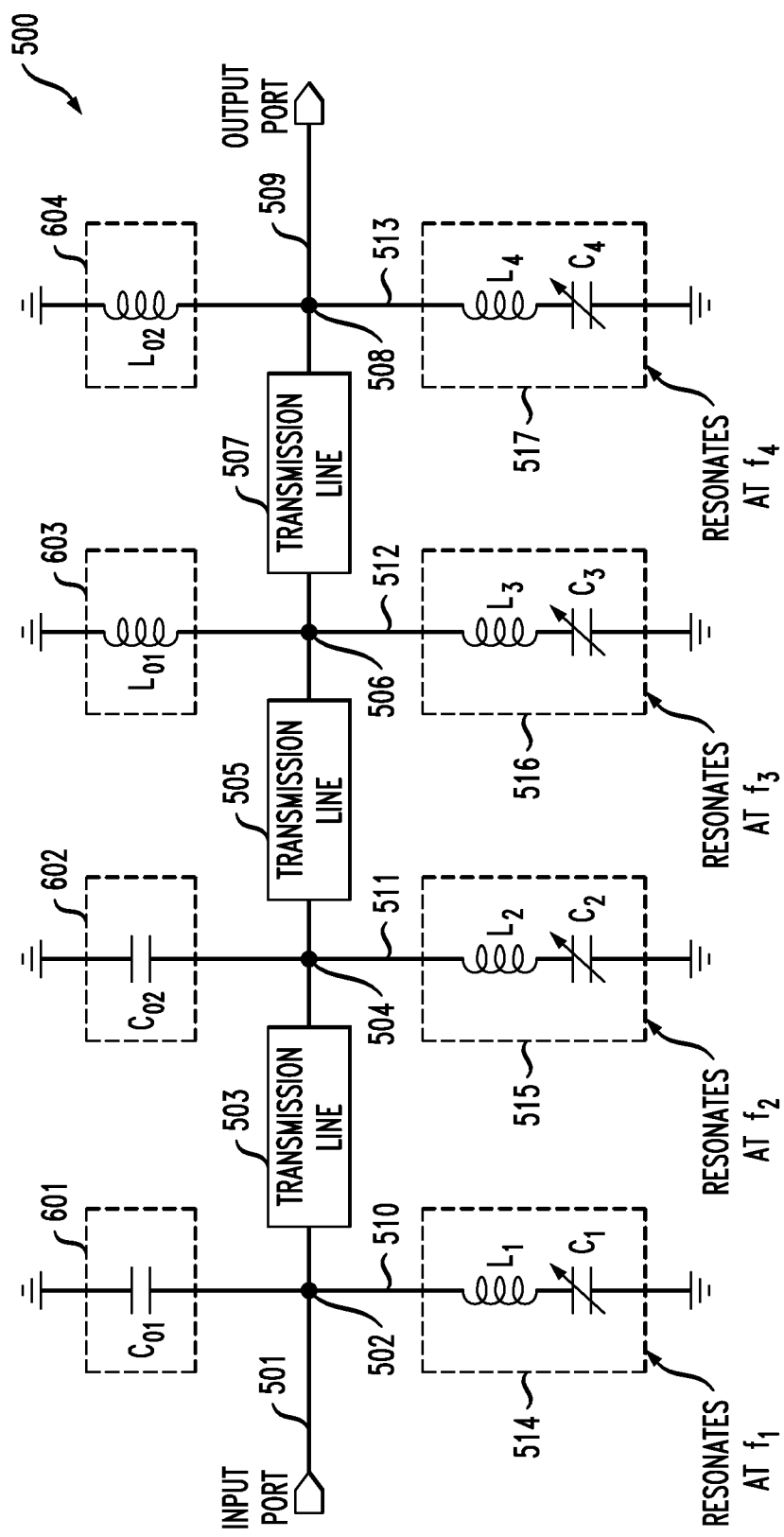
FIG. 7 is a schematic diagram depicting an equivalent circuit of the filter shown in FIG. 5.

FIG. 7 provides a circuit schematic diagram illustrating an equivalent circuit for one possible implementation of filter 500 of FIG. 5. In this implementation, non-resonant nodes 502 and 504 are implemented as structures having capacitances $C_{O1}$ and $C_{O2}$ to ground, while non-resonant nodes 506 and 508 are implemented as structures having inductances $L_{O1}$ and $L_{O2}$ to ground. The equivalent circuits for tunable resonators 514-517 are depicted as inductances $L_1$-$L_4$ connected in series with adjustable capacitances $C_1$-$C_4$, respectively. Resonators 514-517 resonate at resonant frequencies $f_1$-$f_4$, respectively. Couplings 503, 505, and 507 are shown as transmission lines.

FIG. 8 is a graph illustrating the frequency-response curve of filter 500 of FIG. 5, assuming that resonators 514-517 are tuned to resonant frequencies $f_1$-$f_4$, respectively. Resonators 514 and 515 provide lower stopband transmission zeros at resonant frequencies $f_1$ and $f_2$, thus creating lower stopband 801, while resonators 516 and 517 provide upper stopband transmission zeros at resonant frequencies $f_3$ and $f_4$, thus creating upper stopband 803. A passband 802 exists roughly between frequencies $f_2$ and $f_3$.

In one embodiment, passband 802 is adjustable, both in center frequency $f_0$ and in the width of the passband (i.e., in bandwidth), by adjusting the capacitances (and thereby the resonant frequencies) of resonators 514-517. For example, the passband bandwidth may be increased without altering the center frequency by adjusting resonators 514 and 515 to have lower resonant frequencies and adjusting resonators 516 and 517 to have correspondingly higher resonant frequencies. By uniformly increasing the resonant frequencies of resonators 514 and 515 and decreasing the resonant frequencies of resonators 516 and 517, while maintaining the same relative distances (i) between the resonant frequencies of resonators 514 and 515 and (ii) between the resonant frequencies of resonators 516 and 517, the bandwidth of the filter may be increased without substantially altering the absolute selectivity of the filter. Conversely, by uniformly decreasing the resonant frequencies of resonators 514 and 515 and increasing the resonant frequencies of resonators 516 and 517, while maintaining the same relative distances (i) between the resonant frequencies of resonators 514 and 515 and (ii) between the resonant frequencies of resonators 516 and 517, the bandwidth of the filter may be decreased without substantially altering the absolute selectivity of the filter. Alternatively, the center frequency of filter 500 may be adjusted without altering the bandwidth by adjusting resonators 514-517 to higher frequencies or to lower frequencies, while maintaining the same relative distances between their resonant frequencies.

It should be understood that non-resonant nodes 502, 504, 506, 508, and resonators 514-517 and nonresonant elements 601, 602, 603, 604 attached to those nodes, may be arranged in any sequence and are not restricted to placement in order of resonant frequency of the resonators as depicted in FIGS. 7 and 8.

Figure 9A:
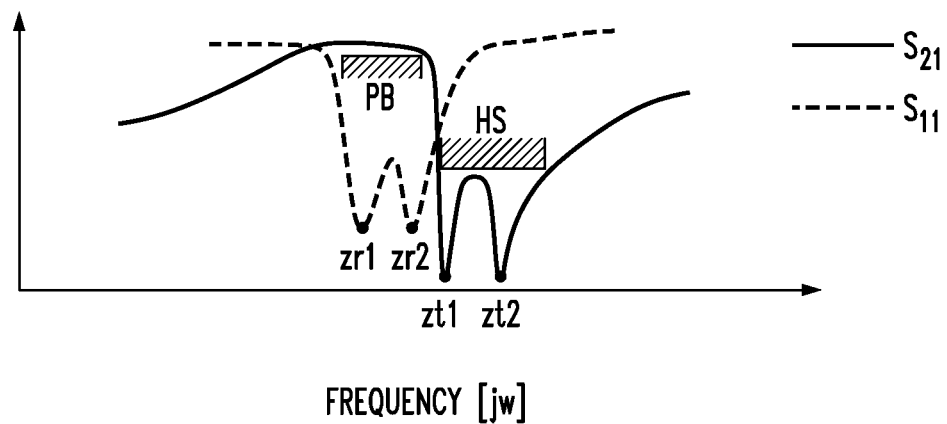
FIGS. 9A and 9B are graphs illustrating frequency-response curves of lowpass-reject and highpass-reject filters.
Figure 9B:
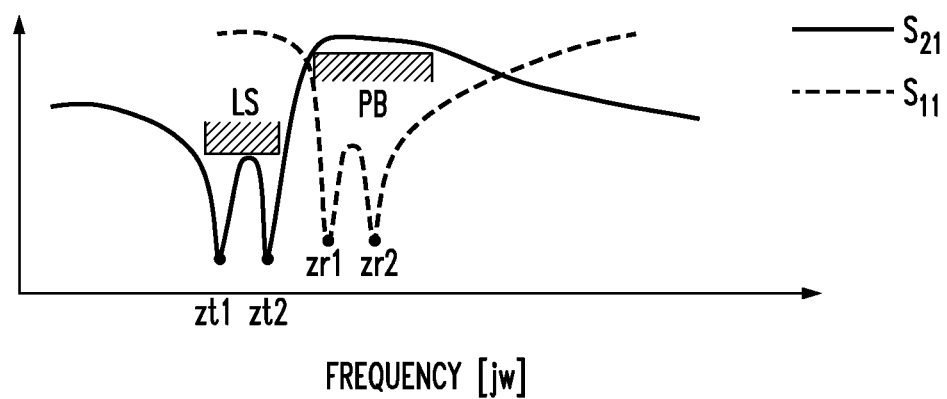

The values of the capacitances and inductances shown in FIG. 7 are preferably selected to produce an agile filter whose bandwidth may be decreased without substantially increasing the selectivity and/or insertion loss of the filter over a predetermined range of bandwidths. In order to select capacitance and inductance values (or distributed-element structure geometries) that result in the frequency-response curve shown in FIG. 8, a filter designer initially determines scattering-parameter polynomials for two separate single-sided prototype filters: a prototype lowpass-reject filter A and a prototype highpass-reject filter B. FIGS. 9A and 9B illustrate the frequency-response ($S_{21}$) and absolute return loss ($S_{11}$) curves for the prototype lowpass-reject and highpass-reject filters. Based on the desired bandpass filter response characteristics, the filter designer identifies upper-stopband, transmission-zero frequencies zt1, zt2 and passband reflection-zero frequencies zr1, zr2 for prototype lowpass-reject filter A, and lower-stopband, transmission-zero frequencies zt1, zt2 and passband reflection-zero frequencies zr1, zr2 for prototype highpass-reject filter B.

Next, the filter designer mathematically characterizes the lowpass-reject and highpass-reject filter responses using rational (lumped-element) lossless models for the scattering parameters $S_{21}$, $S_{11}$ and $S_{22}$ of the prototype filters in the normalized complex-frequency domain (s=jω+Ω). In so doing, the designer constructs the constituent polynomials $P_A(s)$, $E_A(s)$, $F_A(s)$ of the scattering parameters for the prototype lowpass-reject filter, where:

$$S_{21A} = \frac{P_A(s)}{E_A(s)}, \tag{1}$$

$$S_{11A} = \frac{F_A(s)}{E_A(s)},$$

and $$S_{22A} = \frac{F_A^*(s)}{E_A(s)};$$

the roots of $P_A(s)$ are the upper-stopband, transmission-zero frequencies $zt_1$, $zt_2$ shown in FIG. 9A for lowpass-reject filter A; the roots of $F_A(s)$ are the passband reflection-zero frequencies $zr_1$, $zr_2$ for lowpass-reject filter A; and the roots of $E_A(s)$ are the poles of lowpass-reject filter A. The designer similarly constructs the constituent polynomials $P_B(s)$, $E_B(s)$, $F_B(s)$ for the scattering parameters of highpass-reject filter B, where:

$$S_{21B} = \frac{P_B(s)}{E_B(s)}, \tag{2}$$

$$S_{11B} = \frac{F_B(s)}{E_B(s)},$$

and $$S_{22B} = \frac{F_B^*(s)}{E_B(s)};$$

the roots of $P_B(s)$ are the lower-stopband, transmission-zero frequencies $zt_1$, $zt_2$ shown in FIG. 9B for highpass-reject filter B; the roots of $F_B(s)$ are the passband reflection-zero frequencies $zr_1$, $zr_2$ for highpass-reject filter B; and the roots of $E_B(s)$ are the poles of highpass-reject filter B.

Next, the designer mathematically combines the constituent polynomials for lowpass-reject filter A and highpass-reject filter B to obtain bandpass polynomial equations F, P, and E in the following form:

$$F = F_A E_B - F_B^* E_A^* \tag{3}$$

$$P = P_A P_B \tag{4}$$

$$E = E_A E_B - F_A^* F_B, \tag{5}$$

where * is the complex para-conjugate operator, as described in Richard J. Cameron et al., Microwave Filters for Communication Systems, p. 208, the teachings of which reference are hereby incorporated by reference in their entirety. Proportionality constants may also be included in Equations (3)-(5) in accordance with techniques known to those of ordinary skill in the art, if a monic E(s) polynomial is desired. (A monic polynomial is a polynomial with a leading coefficient of 1.) The designer may then determine combined scattering parameters as follows:

$$S_{21} = \frac{P(s)}{E(s)}, \tag{6}$$

$$S_{11} = \frac{F(s)}{E(s)},$$

and $$S_{22} = \frac{F^*(s)}{E(s)}.$$

Given the polynomials F, P, and E, the designer may then synthesize and determine a physical geometry for an implementation of bandpass filter 500 having the non-resonant-node (NRN) combline filter architecture depicted in FIG. 5, based on the polynomials F, P, and E.

FIG. 10 illustrates an exemplary embodiment of a physical implementation of filter 500 of FIG. 5. In one embodiment, filter 1000 is an assembly comprising a main transmission line formed by coupling sections 501, 503, 505, 507, and 509, positioned between grounded structures 1013, 1014. Resonators 514-517 are formed by cavity structures having surfaces 1009, 1010, 1011, 1012 within structure 1004. Resonators 514-517 are connected to the main transmission line via electromagnetic coupling to branch coupling lines 1001-1004.

In the embodiment shown in FIG. 10, branch coupling lines 1001-1004 provide both (i) branch couplings 510-513 of FIG. 5 between resonators 514-517 and the main transmission line and (ii) non-resonant-node capacitances $C_{01}$, $C_{02}$ and inductances $L_{01}$, $L_{02}$ of FIG. 7. In particular, each of branch-coupling lines 1001, 1002 has an open-circuited end within the cavity formed by a respective one of grounded surfaces 1009, 1010. Branch-coupling lines 1001, 1002 therefore act as capacitances $C_{01}$, $C_{02}$ connected to ground, in addition to providing coupling to resonators 514, 515. Each of branch-coupling lines 1003, 1004, on the other hand, has an end that is short-circuited to a respective one of grounded surfaces 1009, 1010 by mechanically coupling the branch-coupling line to the cavity surface via a screw, solder joint, etc. Branch-coupling lines 1003, 1004 therefore act as inductances $L_{01}$, $L_{02}$ connected to ground, in addition to providing coupling to resonators 516, 517.

Resonators 514-517 also comprise tuning screws 1005-1008 for adjusting the capacitances (and thereby the resonant frequencies) of the resonators. By adjusting the resonant frequencies of resonators 514-517, the location of the center frequency and/or the width of the passband of filter 500 may be adjusted.

Figure 11:
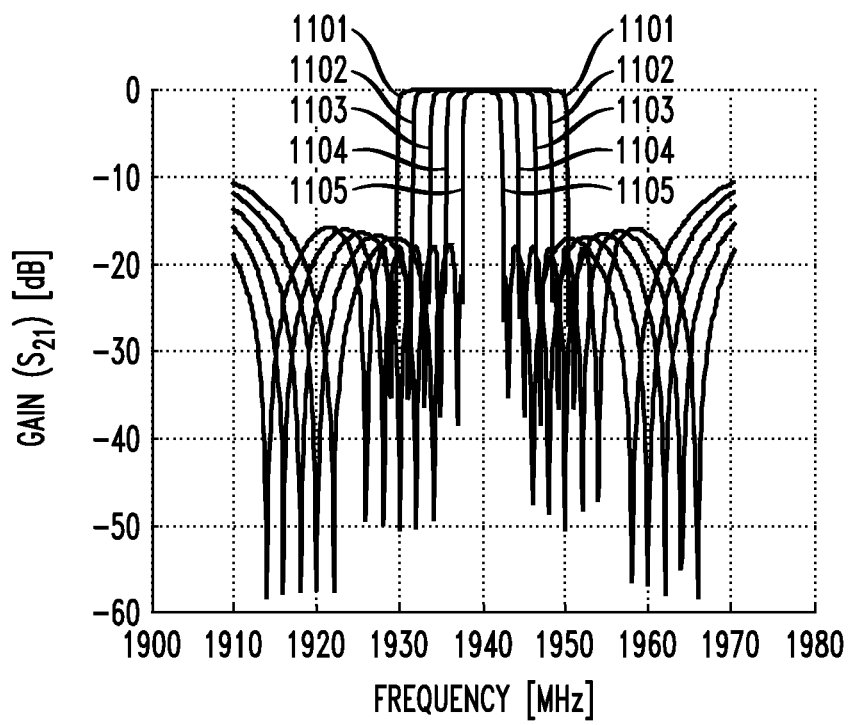
FIG. 11 is a graph illustrating frequency-response curves of an eighth-order filter having a topology similar to the filter shown in FIG. 5, for five different bandwidths.
Figure 12:
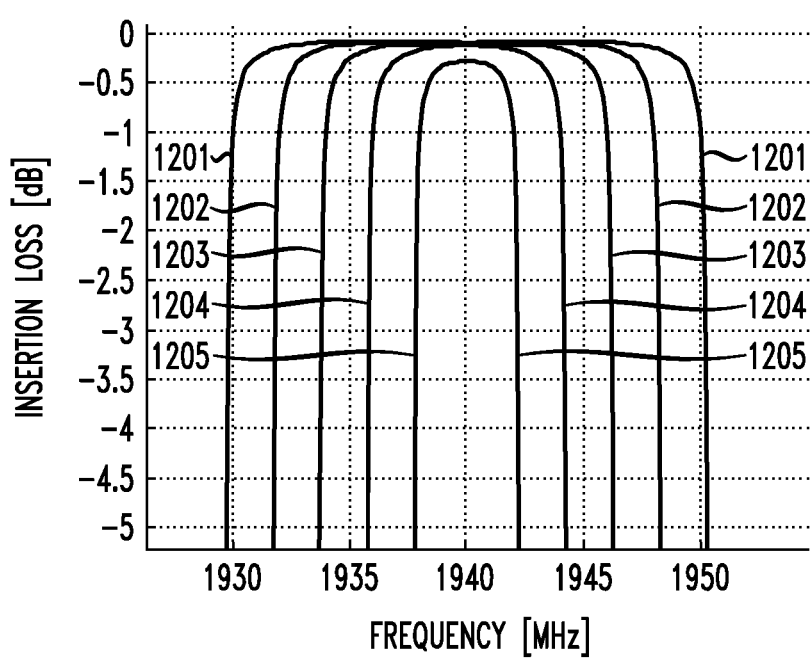
FIG. 12 is a graph illustrating the insertion loss curves of the filter of FIG. 11, for the same five different bandwidths as in FIG. 11.
Figures 13, 14:
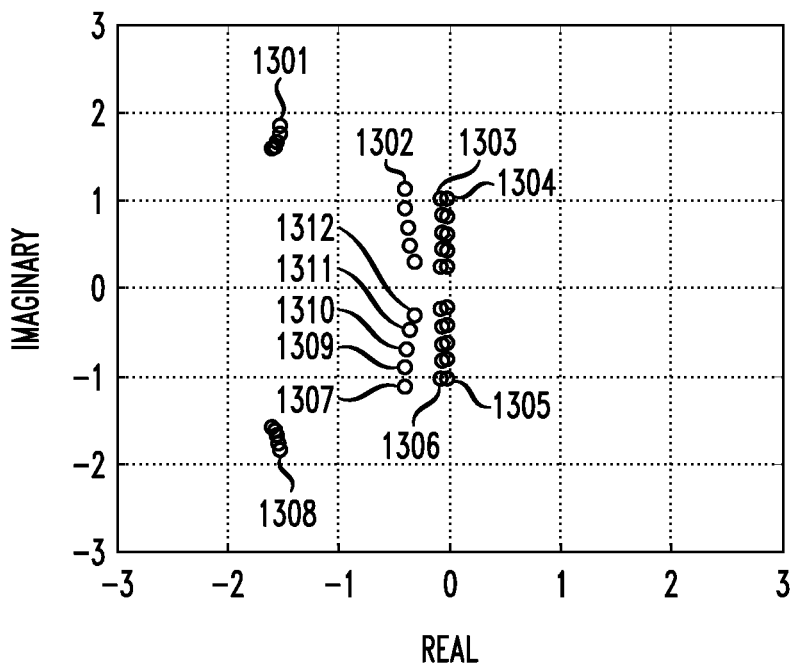
FIG. 13 is a graph illustrating the pole locations of the filter of FIG. 11, for the same five different bandwidths as in FIG. 11.
FIG. 14 is a table comparing the characteristics of filters having an architecture similar to the filter shown in FIG. 5 with the characteristics of filters having an architecture similar to the filter shown in FIG. 1.

FIGS. 11-13 illustrate simulated effects of adjusting the resonant frequencies of resonators in an eighth-order filter (not shown) having a topology similar to filter 500 of FIG. 5 in accordance with one embodiment of the present invention, in order to change the bandwidth of the eighth-order filter. FIG. 11 shows response curves 1101-1105 for five different settings of the filter's resonators corresponding to five different bandwidths having the same center frequency in order of decreasing bandwidth, where the bandwidth is adjusted by uniformly increasing the resonant frequencies of resonators having resonant frequencies higher than the center frequency of the eighth-order filter and decreasing the resonant frequencies of resonators having resonant frequencies lower than the center frequency. FIG. 12 illustrates insertion-loss curves 1201-1205, which respectively correspond to response curves 1101-1105 of FIG. 11.

It may be seen from FIGS. 11 and 12 that, as the bandwidth of the eighth-order filter is decreased, the relative selectivity and the relative insertion loss decrease, while the absolute selectivity and the absolute insertion loss remain substantially constant. For example, the absolute insertion loss varies by less than about 0.5 dB for bandwidths from about 4 MHz to about 20 MHz, and by less than about 0.1 dB for bandwidths from about 8 MHz to about 20 MHz, at a center frequency of about 1940 MHz.

Moreover, as the bandwidth of the eighth-order filter is decreased, the absolute input and output return losses remain substantially constant (within a few-decibel range of variation), and the relative input and output return losses decrease. The relative input (output) return loss is defined as the bandwidth of the filter times the absolute input (output) return loss.

Based on the above results, the eighth-order filter of FIGS. 11-12 is suitable for low-loss combining applications, as is the fourth-order filter 500 of FIG. 5.

FIG. 13 is a diagram showing the simulated movement of the poles of the eighth-order filter of FIGS. 11 and 12 in the normalized complex plane as the magnitude of the bandwidth is changed. (The poles of the filter correspond to the roots of the E(s) polynomial given by Equation (5) above.) In FIG. 13, the bandwidth of the eight-order filter is normalized to the interval from −1 Hz to 1 Hz for the sake of comparison, in the same manner discussed above with respect to FIG. 4. It may be seen from FIG. 13 that the poles for a given bandwidth (e.g., poles 1301-1308) do not form a semi-elliptical pattern. Thus, the filter is not Chebyshev for any bandwidth value).

Furthermore, as the bandwidth is decreased over a predetermined range of bandwidths, the poles tend to move closer to the real axis but not substantially closer to the imaginary axis. In other words, as the bandwidth is decreased, poles having a positive imaginary component (e.g., poles represented by circles 1302-1304) tend to move in a generally downward direction toward the real axis, while poles having a negative imaginary component (e.g., poles represented by circles 1305, 1306, and 1308) tend to move in a generally upward direction toward the real axis. In one embodiment, as the bandwidth is adjusted in a range between about 8 MHz and about 20 MHz, poles having a positive imaginary component (e.g., poles represented by circles 1302-1304) move in the real-imaginary plane no closer to the imaginary axis than along a curve having a slope that is not greater than about −6 imaginary/real units, and more preferably not greater than about −10 imaginary/real units, while poles having a negative imaginary component (e.g., poles represented by circles 1305, 1306 and 1308) move in the real-imaginary plane no closer to the imaginary axis than along a curve having a slope that is not less than about +6 imaginary/real units, and more preferably not less than about +10 imaginary/real units. Thus, the imaginary components of the poles vary with changes in bandwidth, but their real components tend to remain substantially constant (e.g., vary by less than about 20%, more preferably less than about 15%, and still more preferably less than about 10%, as the bandwidth is adjusted in a range between about 8 MHz and about 20 MHz.

For example, circles 1307 and 1309-1312 in FIG. 13 represent corresponding poles for the five different response curves 1101-1105 of FIG. 11, normalized in the manner discussed above. The corresponding poles move vertically toward the real axis but do not substantially move horizontally toward the imaginary axis as the bandwidth is decreased. (The pole represented by circle 1312 moves toward circle 1307 along a curve having a slope of about +4 imaginary/real units between circles 1311 and 1312, about +6 imaginary/real units between circles 1311 and 1310, and in the range between about +8-10 imaginary/real units or greater between circles 1310, 1309, and 1307, as the bandwidth is adjusted in a range between about 4 MHz and about 20 MHz.) As shown in FIG. 13, two of the poles (e.g., poles represented by circles 1301 and 1308) actually move away from the imaginary axis as the bandwidth decreases.

It will be recognized that the movement of the poles described above is reversed when the bandwidth is increased, rather than decreased. As the bandwidth is increased over a predetermined range of bandwidths, the poles tend to move away from the real axis but not substantially closer to the imaginary axis. In other words, as the bandwidth is increased, poles having a positive imaginary component (e.g., poles represented by circles 1302-1304) tend to move in a generally upward direction away from the real axis, while poles having a negative imaginary component (e.g., poles represented by circles 1305, 1306, and 1308) tend to move in a generally downward direction away from the real axis.

FIG. 14 is a table summarizing possible advantages of filters having a combline NRN structure as in FIG. 5 in comparison to the dual-band filter architecture depicted in FIG. 1. A dual-band filter of order N has: (i) a relative selectivity that is similar to that of a filter of order N/2, independent of bandwidth, (ii) a poor near-band rejection (i.e., close-to-the-passband, out-of-band attenuation) due to an inability to arbitrarily place transmission zeros between the dual passbands, (iii) absolute losses that are bandwidth-dependent, and (iv) an absolute selectivity that is bandwidth-dependent. In contrast, a combline NRN filter has (i) a relative selectivity that is similar to that of a filter of order less than N (depending on the bandwidth), but greater than N/2, (ii) very good near-band rejection (e.g., between about 500 KHz and about 1 MHz band guard from passband and attenuated band), (iii) absolute losses that are substantially bandwidth-independent, and (iv) an absolute selectivity that is substantially bandwidth-independent. Moreover, combline NRN filters are suitable for high-power applications (about 100 W). As such, combline NRN filters are suitable for use, e.g., in low-loss filter combiners for wireless base stations that are compatible with the LTE and WiMAX standards.

FIG. 15 contains a legend of the symbols that are used on FIGS. 16-20. For example, block 1502 depicts a low-pass filter having a passband corner frequency of fc. Block 1504 depicts a high-pass filter having a passband corner frequency of fc. Block 1506 depicts a bandpass filter having a lower corner frequency of $f_{c1}$ and an upper corner frequency of $f_{c2}$, and block 1508 depicts a bandstop filter having a lower-passband corner frequency of $f_{c1}$ and an upper-passband corner frequency of $f_{c2}$. A fixed band edge is depicted as a rising or falling line, while a tunable band edge is depicted as a rising or falling line with a double-ended arrow passing horizontally through the midpoint.

FIGS. 16-20 illustrate exemplary compound-filter embodiments that can be constructed using one or more filters having a topology similar to the filter shown in FIG. 5 and physically implemented in a similar manner as the filter shown in FIG. 10 above.

Figure 16:
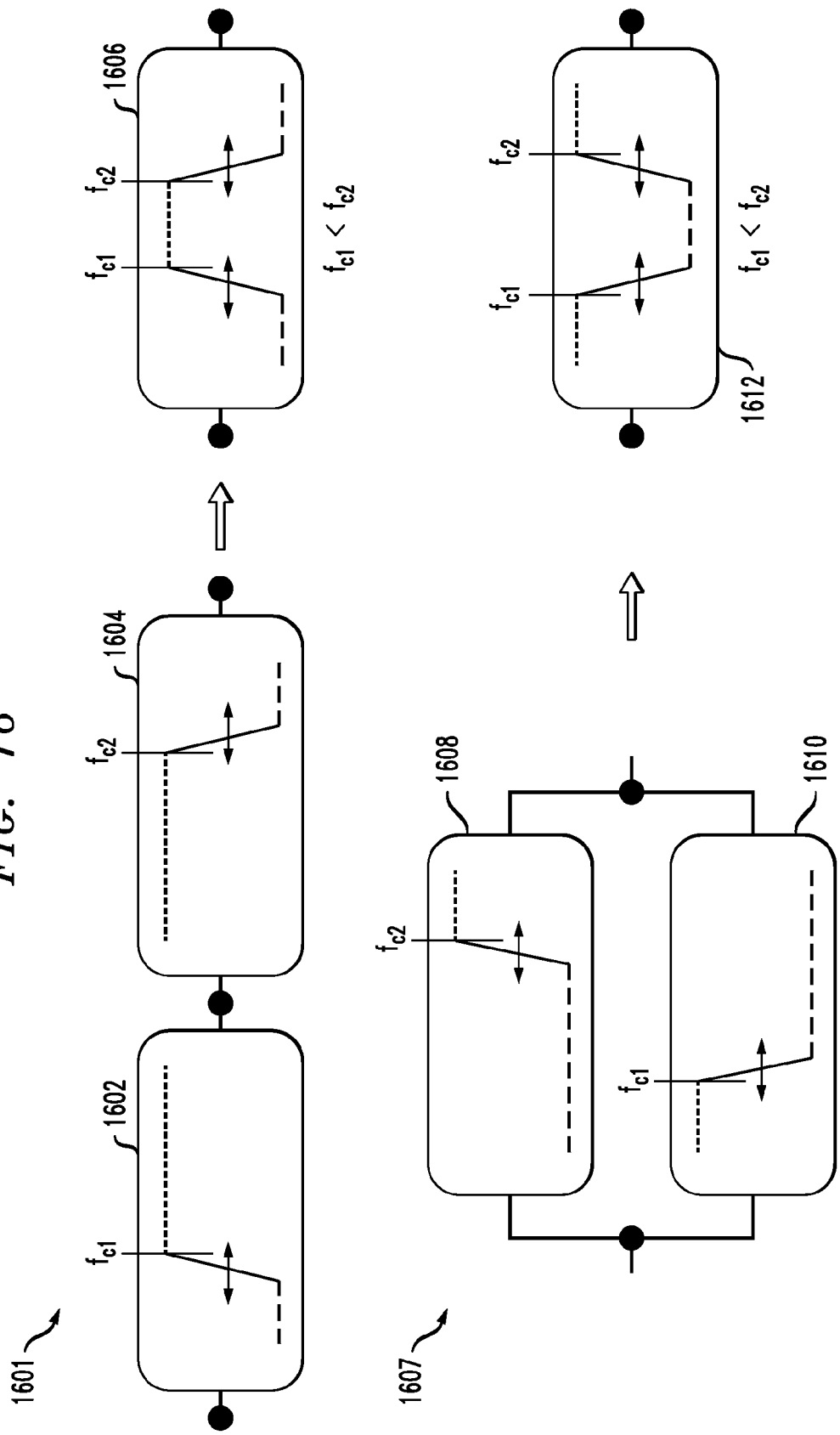
FIGS. 16-20 illustrate exemplary compound-filter embodiments applying filters having an architecture similar to the filter shown in FIG. 5.

In FIG. 16, compound filter 1601 comprises a high-pass filter 1602 having a tunable corner frequency $f_{c1}$ connected in series with a low-pass filter 1604 having a tunable corner frequency $f_{c2}$, where frequency $f_{c1}$ is less than frequency $f_{c2}$. As shown in block 1606, the composite transfer function of compound filter 1601 has bandpass characteristics, with a lower stopband, an upper stopband, and a passband that is adjustable in both bandwidth and center frequency.

Compound filter 1607 shown in FIG. 16 comprises a high-pass filter 1608 having a tunable corner frequency $f_{c2}$ connected in parallel with low-pass filter 1610 having a tunable corner frequency $f_{c1}$, where $f_{c1}<f_{c2}$. As shown in block 1612, the composite transfer function of compound filter 1607 has lower and upper passbands and a stopband that is adjustable in both bandwidth and center frequency. Notably, the transfer function of compound filter 1601 is the inverse of the transfer function of compound filter 1607 (and vice versa), and compound filter 1601 is therefore the dual of compound filter 1607 (and vice versa). Thus, compound filters 1601 and 1607 may be used in a low-loss combiner in a wireless base station to combine the transmission (TX) bands of two operators or transmission standards, where one operator/standard uses a contiguous transmission band from frequency $f_{c1}$ through frequency $f_{c2}$, while the other operator/standard uses the non-contiguous frequency bands made up of the frequencies less than frequency $f_{c1}$ and the frequencies greater than frequency $f_{c2}$.

Figure 17:
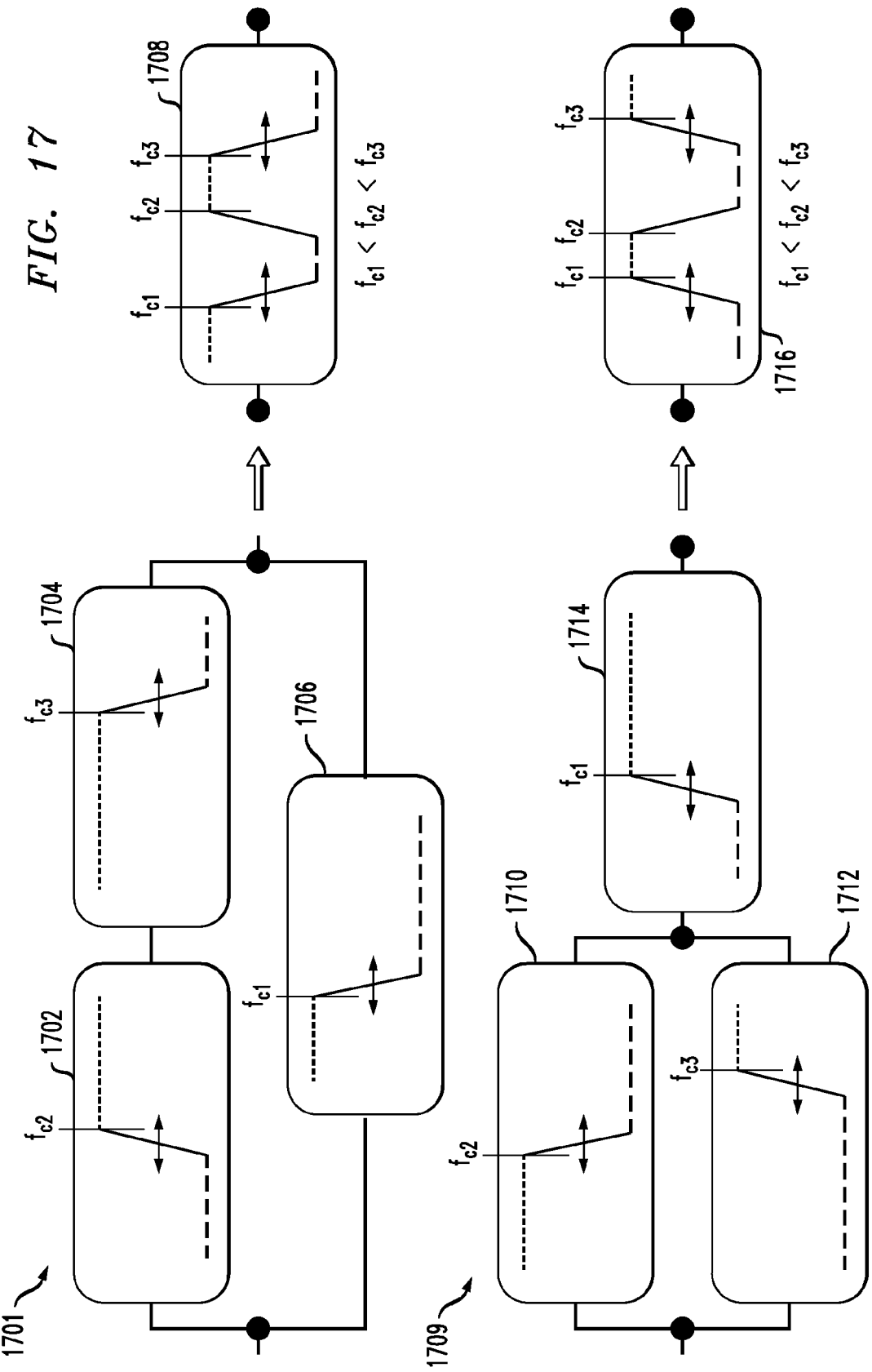

FIG. 17 depicts compound filters 1701 and 1709. Compound filter 1701 comprises two parallel paths. In the first path, high-pass filter 1702, having a fixed corner frequency $f_{c2}$, is connected in series with low-pass filter 1704 having an adjustable corner frequency $f_{c3}$. Low-pass filter 1706, having an adjustable corner frequency $f_{c1}$, is located in the second path and connected in parallel with serially connected filters 1702 and 1704, where $f_{c1}<f_{c2}<f_{c3}$. As shown in block 1708, the composite transfer function of compound filter 1701 has partially tunable lower and upper passbands, each with an adjacent higher stopband, wherein the lower passband has corner frequency $f_{c1}$ and the upper passband has corner frequencies $f_{c2}$ and $f_{c3}$.

Compound filter 1709 comprises two serially connected sections: a first section comprising low-pass filter 1710 having a fixed corner frequency $f_{c2}$ connected in parallel with a high-pass filter 1712 having an adjustable corner frequency $f_{c3}$, and a second section comprising high-pass filter 1714 having an adjustable corner frequency $f_{c1}$, where $f_{c1}<f_{c2}<f_{c3}$. As shown in block 1716, the composite transfer function of compound filter 1709 has two partially tunable lower and upper passbands, each with an adjacent lower stopband, wherein the lower passband has corner frequencies $f_{c1}$ and $f_{c2}$ and the upper passband has corner frequency $f_{c3}$. Like compound filters 1601 and 1607, the transfer function of compound filter 1701 is the inverse of the transfer function of compound filter 1709 (and vice versa), such that compound filter 1701 is the dual of compound filter 1709 (and vice versa). Thus, compound filters 1701 and 1709 may be used in a low-loss combiner in a wireless base station to combine the transmission (TX) and receive (RX) bands of two operators or standards, with both operators/standards having contiguous frequency bands. Alternatively, one operator/standard can use two non-contiguous bands (e.g., one band having frequencies less than $f_{c1}$ and the other band having frequencies between $f_{c2}$ and $f_{c3}$), while the other operator/standard can use the two non-contiguous bands (i) between $f_{c1}$ and $f_{c2}$ and (ii) greater than $f_{c3}$.

Figure 18:
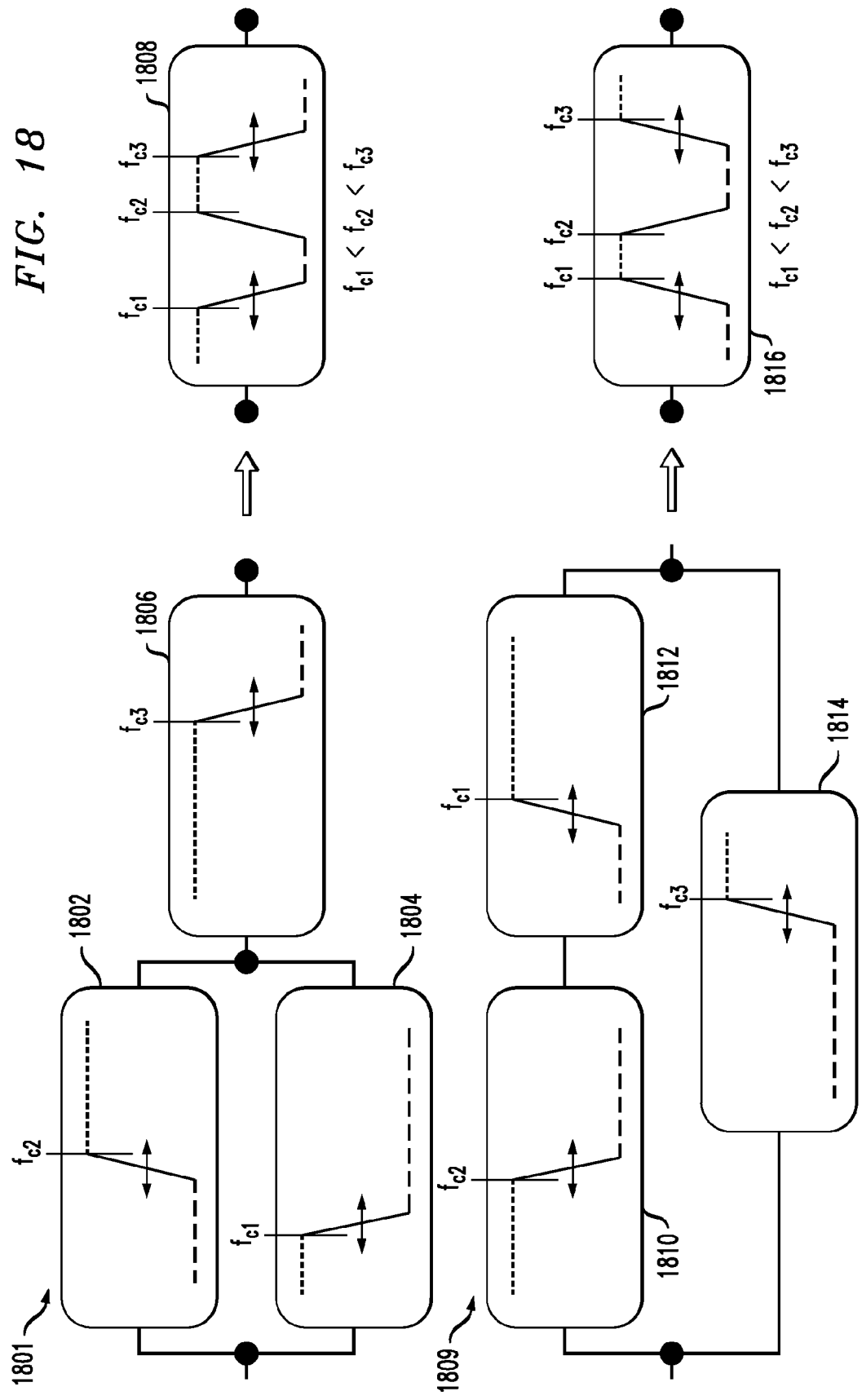

FIG. 18 depicts compound filters 1801 and 1809. Compound filter 1801 comprises two serially connected sections: a first section comprising high-pass filter 1802 having a fixed corner frequency $f_{c2}$ connected in parallel with low-pass filter 1804 having an adjustable corner frequency $f_{c1}$, and a second section comprising low-pass filter 1806 having an adjustable corner frequency $f_{c3}$, where $f_{c1}<f_{c2}<f_{c3}$. As shown in block 1808, the composite transfer function of compound filter 1801 has two partially tunable lower and upper passbands, each with an adjacent upper stopband, wherein the lower passband has corner frequency $f_{c1}$, and the upper passband has corner frequencies $f_{c2}$ and $f_{c3}$.

Compound filter 1809 comprises two parallel paths. In the first path, low-pass filter 1810 having a fixed corner frequency $f_{c2}$ is connected in series with high-pass filter 1812 having an adjustable corner frequency $f_{c1}$. High-pass filter 1814, having an adjustable corner frequency $f_{c3}$, is located in the second path and connected in parallel with serially connected filters 1810 and 1812, where $f_{c1}<f_{c2}<f_{c3}$. As shown in block 1816, the composite transfer function of compound filter 1809 has partially tunable lower and upper passbands, each with an adjacent lower stopband, wherein the lower passband has corner frequencies of $f_{c1}$ and $f_{c2}$ and the upper passband has corner frequency of $f_{c3}$.

Like compound filters 1701 and 1709, the transfer function of compound filter 1801 is the inverse of the transfer function of compound filter 1809 (and vice versa), such that compound filter 1801 is the dual of compound filter 1809 (and vice versa). Thus, compound filters 1801 and 1809 may be used in a low-loss combiner in a wireless base station to combine the transmission (TX) and receive (RX) bands of two operators or standards, with both operators/standards having contiguous frequency bands. Alternatively, one operator/standard can use the two non-contiguous bands (i) less than $f_{c1}$ and (ii) between $f_{c2}$ and $f_{c3}$, while the other operator/standard can use the two non-contiguous bands (i) between $f_{c1}$ and $f_{c2}$ and (ii) greater than $f_{c3}$.

Figure 19:
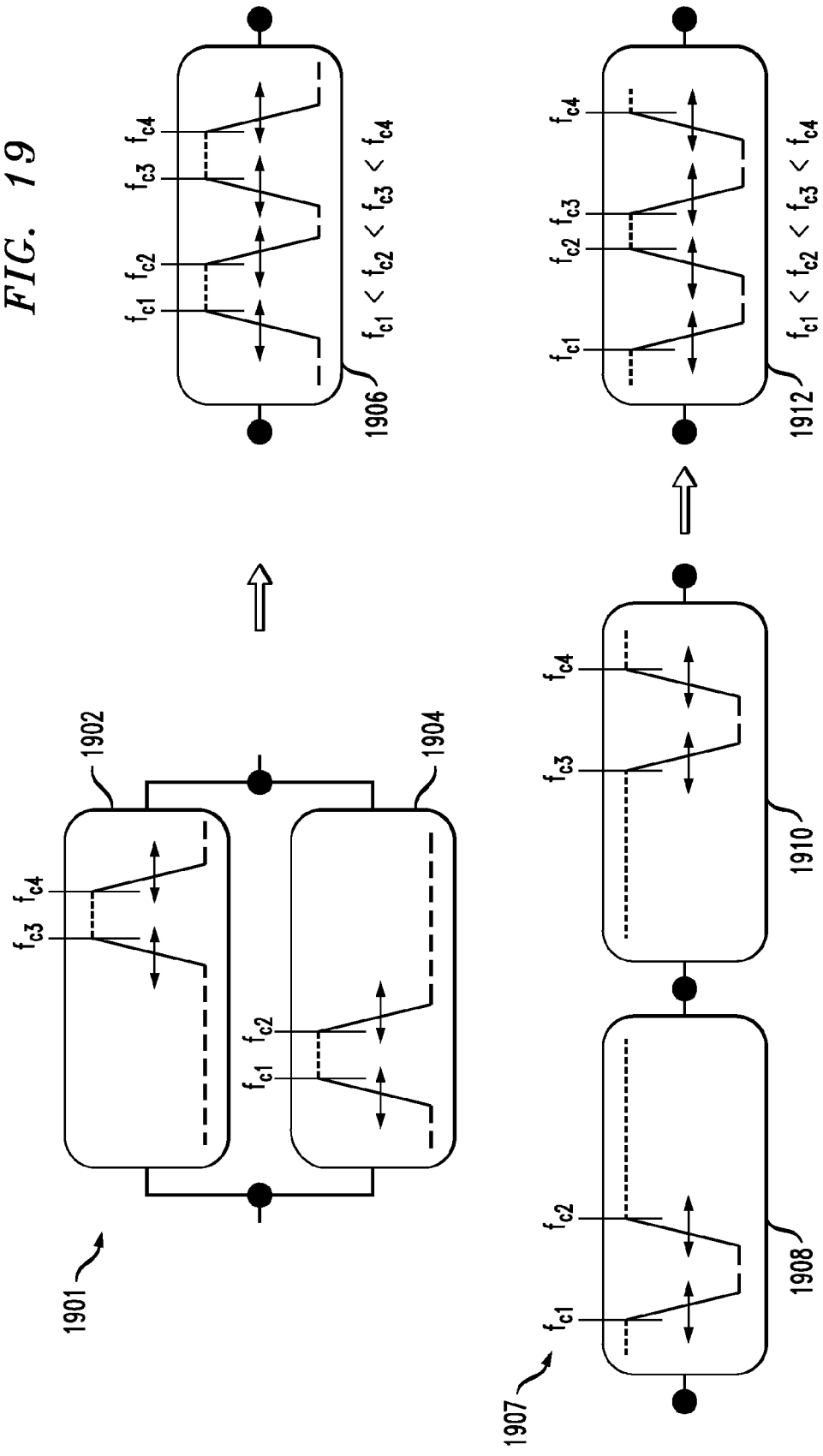

FIG. 19 depicts compound filters 1901 and 1907. Compound filter 1901 comprises bandpass filter 1902 having adjustable passband corner frequencies of $f_{c3}$ and $f_{c4}$ connected in parallel with bandpass filter 1904 having adjustable passband corner frequencies of $f_{c1}$ and $f_{c2}$, where $f_{c1}<f_{c2}<f_{c3}<f_{c4}$. Each of bandpass filters 1902 and 1904 is implemented similarly to compound filter 1601 shown in FIG. 16 described above. As shown in block 1906, the composite transfer function of compound filter 1901 has a lower stopband, a fully tunable lower passband having passband corner frequencies of $f_{c1}$ and $f_{c2}$, an inner stopband, a fully tunable upper passband having passband corner frequencies of $f_{c3}$ and $f_{c4}$, and an upper stopband.

Compound filter 1907 comprises bandstop filter 1908 having adjustable passband corner frequencies of $f_{c1}$ and $f_{c2}$ connected in series with bandstop filter 1910 having adjustable passband corner frequencies of $f_{c3}$ and $f_{c4}$, where $f_{c1}<f_{c2}<f_{c3}<f_{c4}$. Each of bandstop filters 1908 and 1910 is implemented similarly to compound filter 1607 shown in FIG. 16 described above. As shown in block 1912, the composite transfer function of compound filter 1907 has a lower passband having a corner frequency of $f_{c1}$, a fully tunable lower stopband, an inner passband having corner frequencies of $f_{c2}$ and $f_{c3}$, a fully tunable upper stopband, and an upper passband having a corner frequency of $f_{c4}$.

Like compound filters 1801 and 1809, the transfer function of compound filter 1901 is the inverse of the transfer function of compound filter 1907 (and vice versa), such that compound filter 1901 is the dual of compound filter 1907 (and vice versa). Thus, compound filters 1901 and 1907 may be used in a low-loss combiner in a wireless base station to combine the transmission (TX) and receive (RX) bands of two operators or standards, with one operator/standard having contiguous frequency bands, and the other operator/standard having non-contiguous frequency bands.

Figure 20:
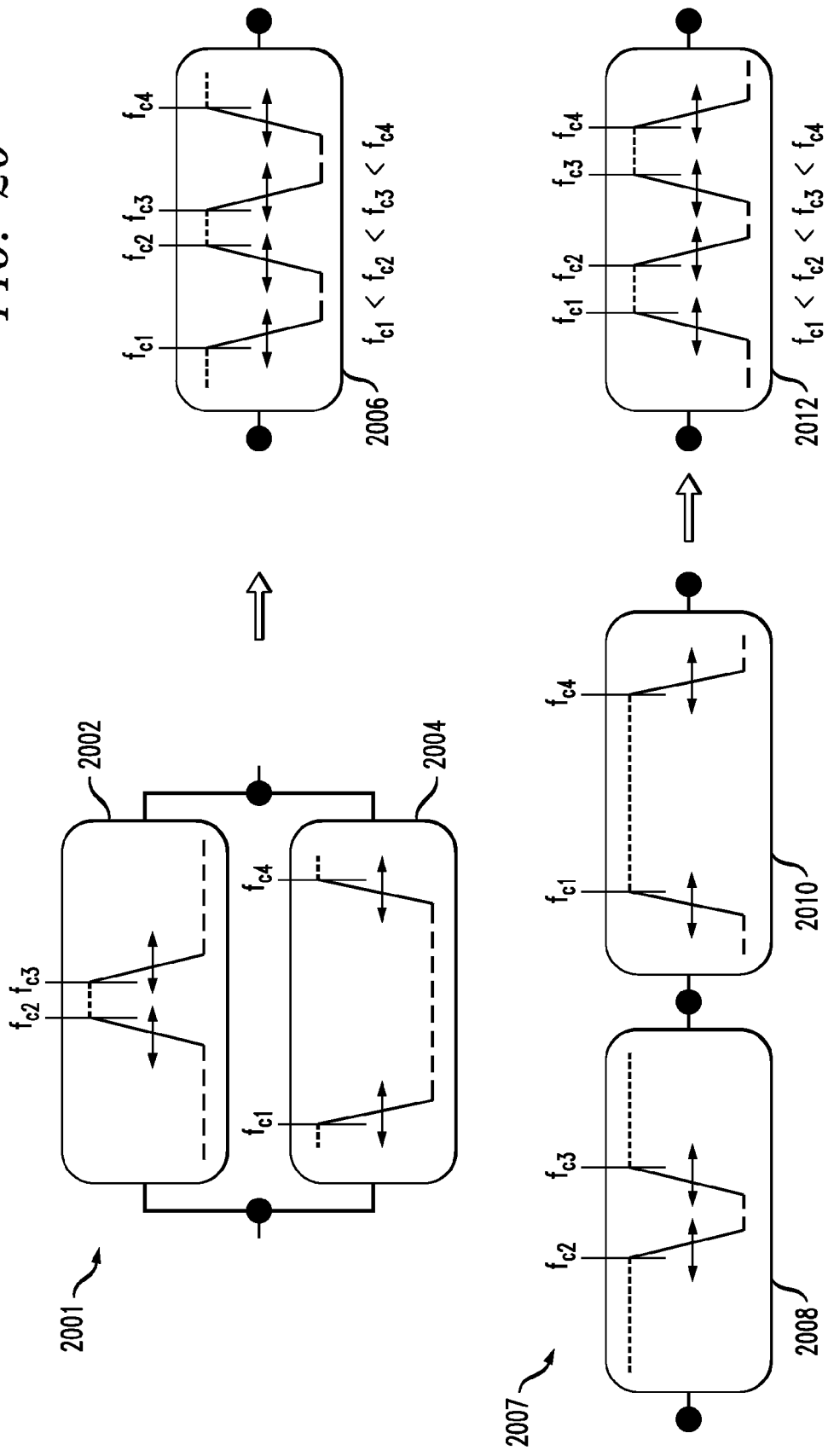

FIG. 20 depicts compound filters 2001 and 2007. Compound filter 2001 comprises bandpass filter 2002 having adjustable passband corner frequencies of $f_{c2}$ and $f_{c3}$ connected in parallel with bandstop filter 2004 having adjustable passband corner frequencies of $f_{c1}$ and $f_{c4}$, where $f_{c1} < f_{c2} < f_{c3} < f_{c4}$. Bandpass filter 2002 is implemented similarly to compound filter 1601, and bandstop filter 2004 is implemented similarly to compound filter 1607. As shown in block 2006, the composite transfer function of compound filter 2001 has a lower passband having a corner frequency of $f_{c1}$, a fully tunable lower stopband, an inner passband having corner frequencies of $f_{c2}$ and $f_{c3}$, a fully tunable upper stopband, and an upper passband having a corner frequency of $f_{c4}$.

Compound filter 2007 comprises bandstop filter 2008 having adjustable passband corner frequencies of $f_{c2}$ and $f_{c3}$ connected in series with bandpass filter 2010 having adjustable corner frequencies of $f_{c1}$ and $f_{c4}$, where $f_{c1} < f_{c2} < f_{c3} < f_{c4}$. Bandstop filter 2008 is implemented similarly to compound filter 1607, and bandpass filter 2010 is implemented similarly to compound filter 1601 described above. As shown in block 2012, the composite transfer function of compound filter 2007 has a lower stopband, a fully tunable lower passband having passband corner frequencies of $f_{c1}$ and $f_{c2}$, an inner stopband, a fully tunable upper passband having passband corner frequencies of $f_{c3}$ and $f_{c4}$, and an upper stopband.

Like compound filters 1901 and 1907, the transfer function of compound filter 2001 is the inverse of the transfer function of compound filter 2007 (and vice versa), such that compound filter 2001 is the dual of compound filter 2007 (and vice versa). Thus, compound filters 2001 and 2007 may be used in a low-loss combiner in a wireless base station to combine the transmission (TX) and receive (RX) bands of two operators or standards, with one operator/standard having contiguous frequency bands, and the other operator/standard having non-contiguous frequency bands. Alternatively, one operator/standard can use the two non-contiguous bands (i) between $f_{c1}$ and $f_{c2}$ and (ii) between $f_{c3}$ and $f_{c4}$, while the other operator/standard can use the three non-contiguous bands (i) less than $f_{c1}$, (ii) between $f_{c2}$ and $f_{c3}$, and (iii) greater than $f_{c4}$.

FIGS. 21(a) and 21(b) depict Table 2, which summarizes the above-described characteristics and exemplary applications of the compound filters shown in FIGS. 16-20.

It will be understood that the high-pass, low-pass, bandpass, and bandstop filters depicted in FIGS. 16-20 may also be implemented as highpass-reject, lowpass-reject, bandpass-reject, and bandstop-bandpass filters. Accordingly, the expression "high-pass filter", as used herein, should be interpreted to encompass a highpass-reject filter, while the expressions "low-pass filter", "bandpass filter", and "bandstop filter", as used herein, should be interpreted to encompass a lowpass-reject filter, a bandpass-reject filter, and a bandstop-bandpass filter, respectively. The term "lowpass-reject filter", as used herein, refers to a filter that has a finite lower passband that is substantially adjacent to a finite upper stopband, e.g., as shown in FIG. 9A, described above. The term "highpass-reject filter", as used herein, refers to a filter that has a finite upper passband that is substantially adjacent to a finite lower stopband, e.g., as shown in FIG. 9B, described above. Similarly, the term "bandpass-reject filter", as used herein, refers to a filter that has three substantially contiguous frequency bands: a finite lower stopband, a finite inner passband, and a finite upper stopband. Finally, the term "bandstop-bandpass filter", as used herein, refers to a filter that has a finite lower passband, a finite inner stopband, and a finite upper passband, wherein all three frequency bands are substantially contiguous. A highpass-reject filter, a lowpass-reject filter, a bandpass-reject filter, or a bandstop-bandpass filter may pass, stop, or partially pass a signal having frequencies that are not within a stopband or passband of the filter. In other words, the filter characteristics for such filters may be defined only for the frequency bands of interest and undefined for other frequency bands that are not of interest.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. A filter for receiving an input signal and providing a filtered output signal, the filter comprising:
   an input coupling adapted to receive the input signal;
   an output coupling adapted to provide the filtered output signal;
   at least three transmission-line couplings forming a main transmission line;
   at least four nodes connected in series between the input coupling and the output coupling, each node being connected to an adjacent node through one of the transmission-line couplings;
   at least four resonant elements, each coupled to a different node of the at least four nodes and each having an adjustable resonant frequency; and
   at least four non-resonant elements, each connected to a different node of the at least four nodes, wherein:
   (i) at least one of the non-resonant elements is one of (a) a capacitor coupled to ground and (b) a structure that is equivalent to a capacitor coupled to ground;
   (ii) at least one of the non-resonant elements is one of (a) an inductor coupled to ground and (b) a structure that is equivalent to an inductor coupled to ground;
   (iii) at least two of the resonant elements provide at least two transmission zeros at at least two different frequencies in a lower stopband of the filter;
   (iv) at least two of the resonant elements provide at least two transmission zeros at at least two different frequencies in an upper stopband of the filter; and
   (v) each of the non-resonant elements provides the coupling between one of the nodes along the main transmission line and a corresponding one of the resonant elements, such that the filter has a bandpass filtering characteristic between the lower and upper stopbands.

2. The filter of claim 1, wherein each node of the at least four nodes is connected to at least one corresponding resonant element and to at least one corresponding non-resonant element.

3. The filter of claim 2, wherein each node of the at least four nodes is connected to only one corresponding resonant element and to only one corresponding non-resonant element.

4. The filter of claim 2, wherein each non-resonant element provides electromagnetic coupling between one of the resonant elements and a corresponding one of the nodes.

5. The filter of claim 1, wherein the at least four non-resonant elements comprises an equal number of capacitive non-resonant elements and inductive non-resonant elements.

6. The filter of claim 1, wherein each transmission-line coupling has a length that is about equal to the wavelength of a center frequency of a passband of the filter divided by four.

7. The filter of claim 1, wherein each resonant element is a cavity resonator.

8. The filter of claim 1, wherein the non-resonant elements are stubs.

9. The filter of claim 1, wherein each non-resonant element provides electromagnetic coupling between one of the resonant elements and one of the nodes.

10. The filter of claim 1, wherein each resonant element has an adjustable capacitance, the adjustment of which causes a corresponding adjustment of the resonant frequency of the resonant element.

11. The filter of claim 1, wherein:
   the resonant elements are adapted such that poles of the filter, when normalized to a predetermined bandwidth and plotted in a real-imaginary plane, move substantially parallel to the imaginary axis when the resonant frequencies of the resonant elements are adjusted, without substantial movement parallel to the real axis.

12. The filter of claim 1, wherein the resonant elements are adapted such that, when poles of the filter are normalized to a predetermined bandwidth and plotted in the real-imaginary plane and the bandwidth of the filter is adjusted in a range between about 8 MHz and about 20 MHz:
   (i) one or more of the poles of the filter having a positive imaginary component move in the real-imaginary plane no closer to the imaginary axis than along a curve having a slope that is not greater than about −6 imaginary/real units, and
   (ii) one or more of the poles of the filter having a negative imaginary component move in the real-imaginary plane no closer to the imaginary axis than along a curve having a slope that is not less than about +6 imaginary/real units.

13. The filter of claim 1, wherein the resonant elements are adapted such that a real component of corresponding poles of the filter changes by no more than about 20% when the bandwidth of the filter is adjusted in a range between about 8 MHz and about 20 MHz.

14. The filter of claim 1, wherein the filter is adapted to have a substantially constant absolute insertion loss when the bandwidth of the filter is adjusted from about 8 MHz to about 20 MHz.

15. The filter of claim 14, wherein the filter is adapted to have an absolute insertion loss that varies by less than about 0.5 dB for bandwidths from about 4 MHz to about 20 MHz.

16. The filter of claim 14, wherein the filter is adapted to have an absolute insertion loss that varies by less than about 0.1 dB for bandwidths from about 8 MHz to about 20 MHz.

17. The filter of claim 1, wherein the filter is adapted to have an absolute selectivity that is constant for bandwidths from about 8 MHz to about 20 MHz.

18. The filter of claim 1, wherein the parameters of the resonant and non-resonant elements are selected based on polynomial equations F, P, and E of scattering parameters of the filter according to the following equations:

$$F = F_A E_B - F^*_B E^*_A$$

$$P = P_A P_B, \text{ and}$$

$$E = E_A E_B - F^*_A F_B;$$

wherein:
   the roots of $P_A$ are upper-stopband, transmission-zero frequencies of a first prototype filter A;
   the roots of $F_A$ are passband reflection-zero frequencies of the first prototype filter A;
   the roots of $E_A$ are the poles of the first prototype filter A;
   the roots of $P_B$ are lower-stopband, transmission-zero frequencies of the second prototype filter B;
   the roots of $F_B$ are passband reflection-zero frequencies of second prototype filter B; and
   the roots of $E_B$ are the poles of the second prototype filter B.

19. The filter of claim 1, wherein:
  each node of the at least four nodes is directly connected to the adjacent node through one of the transmission-line couplings, without any intervening elements;
  each node of the at least four nodes is connected to only one corresponding resonant element and to only one corresponding non-resonant element;
  each non-resonant element provides electromagnetic coupling between one of the resonant elements and one of the at least four nodes;
  the at least four non-resonant elements comprises an equal number of capacitive non-resonant elements and inductive non-resonant elements;
  each transmission-line coupling has a length that is about equal to wavelength of a center frequency of the passband of the filter divided by four;
  each resonant element is a cavity resonator;
  the non-resonant elements are stubs;
  each resonant element has an adjustable capacitance, the adjustment of which causes a corresponding adjustment of the resonant frequency of the resonant element;
  the resonant elements are adapted such that poles of the filter, when normalized to a predetermined bandwidth and plotted in a real-imaginary plane, move substantially parallel to the imaginary axis when the resonant frequencies of the resonant elements are adjusted, without substantial movement parallel to the real axis; and
  the resonant elements are adapted such that the real component of each pole of the filter changes by no more than about 20% when the bandwidth of the filter is adjusted in a range between about 8 MHz and about 20 MHz.

20. A method of constructing a filter adapted to receive an input signal and provide a filtered output signal, the method comprising:
  providing an input coupling adapted to receive the input signal;
  providing an output coupling adapted to provide the filtered output signal;
  providing at least three transmission-line couplings forming a main transmission line;
  providing at least four nodes connected in series between the input coupling and the output coupling, each node being directly connected to an adjacent node through one of the transmission-line couplings;
  providing at least four resonant elements, each coupled to a different node of the at least four nodes and each having an adjustable resonant frequency; and
  providing at least four non-resonant elements, each connected to a different node of the at least four nodes, wherein:
    (i) at least one of the non-resonant elements is one of (a) a capacitor coupled to ground and (b) a structure that is equivalent to a capacitor coupled to ground, and at least one of the non-resonant elements is one of (a) an inductor coupled to ground and (b) a structure that is equivalent to an inductor coupled to ground;
    (ii) at least two of the resonant elements provide at least two transmission zeros at at least two different frequencies in a lower stopband of the filter; and
    (iii) at least two of the resonant elements provide at least two transmission zeros at at least two different frequencies in an upper stopband of the filter; and
    (iv) each of the non-resonant elements provides the coupling between one of the nodes along the main transmission line and a corresponding one of the resonant elements, such that the filter has a bandpass filtering characteristic between the lower and upper stopbands.

21. A method of adjusting a bandwidth of a filter comprising (1) an input coupling adapted to receive the input signal; (2) an output coupling adapted to provide the filtered output signal; (3) at least three transmission-line couplings forming a main transmission line; (4) at least four nodes connected in series between the input coupling and the output coupling, each node being directly connected to an adjacent node through one of the transmission-line couplings; (5) at least four resonant elements, each coupled to a different node and each having an adjustable resonant frequency, and (6) at least four non-resonant elements, each connected to a different node of the at least four nodes, wherein: (i) at least one non-resonant element is one of (a) a capacitor coupled to ground and (b) a structure that is equivalent to a capacitor coupled to ground, and at least one non-resonant element is one of (a) an inductor coupled to ground and (b) a structure that is equivalent to an inductor coupled to ground, (ii) a first resonant element provides a first transmission zero at a first resonant frequency in a lower stopband of the filter, (iii) a second resonant element provides a second transmission zero at a second resonant frequency, greater than the first resonant frequency, in the lower stopband of the filter, (iv) a third resonant element provides a third transmission zero at a third resonant frequency, greater than the second resonant frequency, in an upper stopband of the filter, (v) a fourth resonant element provides a fourth transmission zero at a fourth resonant frequency, greater than the third resonant frequency, in the upper stopband of the filter, and (vi) each of the non-resonant elements provides the coupling between one of the nodes along the main transmission line and a corresponding one of the resonant elements, such that the filter has a bandpass filtering characteristic between the lower and upper stopbands, the method comprising:
  adjusting a characteristic of the first resonant element, such that the first resonant frequency is adjusted by a first frequency difference; and
  adjusting a characteristic of the fourth resonant element, such that the fourth resonant frequency is adjusted by a negative of about the first frequency difference, wherein the bandwidth of the filter is adjusted without altering a center frequency of the filter;
  adjusting a characteristic of the second resonant element, such that the second resonant frequency is adjusted by about a second frequency difference;
  adjusting a characteristic of the third resonant element, such that the third resonant frequency is adjusted by a negative of about the second frequency difference, wherein the bandwidth of the filter is adjusted without altering the center frequency of the filter;
  the bandwidth of the filter is adjusted without altering an absolute selectivity of the filter.

* * * * *

UNITED STATES PATENT AND TRADEMARK OFFICE
CERTIFICATE OF CORRECTION

PATENT NO. : 9,515,362 B2
APPLICATION NO. : 13/774363
DATED : December 6, 2016
INVENTOR(S) : Tamiazzo et al.

It is certified that error appears in the above-identified patent and that said Letters Patent is hereby corrected as shown below:

In the Claims

Column 19, Claim 19, Line 15:
Please correct "equal to wavelength" to read -- equal to a wavelength --

Signed and Sealed this
Third Day of October, 2017

Joseph Matal
*Performing the Functions and Duties of the*
*Under Secretary of Commerce for Intellectual Property and*
*Director of the United States Patent and Trademark Office*